United States Patent
Enomoto et al.

(10) Patent No.: US 12,379,200 B2
(45) Date of Patent: Aug. 5, 2025

(54) PERIPHERAL EDGE PROCESSING APPARATUS, PERIPHERAL EDGE PROCESSING METHOD, AND COMPUTER-READABLE RECORDING MEDIUM

(71) Applicant: TOKYO ELECTRON LIMITED, Tokyo (JP)

(72) Inventors: Masashi Enomoto, Kumamoto (JP); Hideaki Kashiwagi, Kumamoto (JP); Naoto Nakamura, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 15 days.

(21) Appl. No.: 18/025,170

(22) PCT Filed: Aug. 19, 2021

(86) PCT No.: PCT/JP2021/030440
§ 371 (c)(1),
(2) Date: Mar. 7, 2023

(87) PCT Pub. No.: WO2022/054528
PCT Pub. Date: Mar. 17, 2022

(65) Prior Publication Data
US 2023/0314960 A1    Oct. 5, 2023

(30) Foreign Application Priority Data
Sep. 8, 2020   (JP) ................................. 2020-150426

(51) Int. Cl.
*G03F 7/20*       (2006.01)
*G01B 11/02*      (2006.01)
(Continued)

(52) U.S. Cl.
CPC ............ *G01B 11/022* (2013.01); *G01B 11/03* (2013.01); *G03F 7/2028* (2013.01);
(Continued)

(58) Field of Classification Search
CPC ......... H01L 21/02057; H01L 21/02041; H01L 21/02087; H01L 21/027; G03F 1/82;
(Continued)

(56) References Cited

U.S. PATENT DOCUMENTS

| | | | |
|---|---|---|---|
| 2013/0084393 A1* | 4/2013 | Kashiyama | ......... H01L 21/6715 118/712 |
| 2014/0124479 A1* | 5/2014 | Tomita | ................... H01L 21/681 216/85 |
| 2017/0287703 A1* | 10/2017 | Amano | ............. H01L 21/67253 |

FOREIGN PATENT DOCUMENTS

| | | |
|---|---|---|
| JP | H04-72614 A | 3/1992 |
| JP | 2003-282427 A | 10/2003 |

(Continued)

OTHER PUBLICATIONS

Decision to Grant a Patent dated Nov. 8, 2023 issued in corresponding Japanese Application No. 2022-547464.

*Primary Examiner* — Erin F Bergner
(74) *Attorney, Agent, or Firm* — Nath, Goldberg & Meyer; Jerald L. Meyer; Tanya E. Harkins

(57) ABSTRACT

An apparatus includes: an capturing part that captures a peripheral edge portion of a substrate including a reference substrate and a workpiece substrate, so as to acquire captured images of the reference and workpiece substrates; a first calculation part that calculates a theoretical peripheral edge position of the reference substrate in the captured image of the reference substrate with reference to a center thereof; a second calculation part that calculates a theoretical peripheral edge position of the workpiece substrate in the captured image of the workpiece substrate based on the (Continued)

theoretical peripheral edge position of the reference substrate and the captured image of the workpiece substrate; a setting part that sets processing parameters for the peripheral edge portion of the substrate based on the theoretical peripheral edge position of the workpiece substrate; and a processing part that processes the peripheral edge portion of the substrate based on the processing parameters.

19 Claims, 20 Drawing Sheets

(51) Int. Cl.
*G01B 11/03* (2006.01)
*G03F 7/00* (2006.01)
*G06T 7/13* (2017.01)
*G06T 7/62* (2017.01)
*G06T 7/73* (2017.01)

(52) U.S. Cl.
CPC .............. *G03F 7/7085* (2013.01); *G06T 7/13* (2017.01); *G06T 7/62* (2017.01); *G06T 7/74* (2017.01); *G01B 2210/56* (2013.01)

(58) Field of Classification Search
CPC ........ G03F 7/2028; G03F 7/7085; G03F 7/20; G01B 11/022; G01B 11/03; G01B 2210/56; G01B 11/272; G01B 11/028; G06T 7/13; G06T 7/62; G06T 7/74; G06T 2207/30148
See application file for complete search history.

(56) References Cited

FOREIGN PATENT DOCUMENTS

| | | |
|---|---|---|
| JP | 2019-68001 A | 4/2019 |
| JP | 2019-212804 A | 12/2019 |

* cited by examiner

PERIPHERAL EDGE PROCESSING APPARATUS, PERIPHERAL EDGE PROCESSING METHOD, AND COMPUTER-READABLE RECORDING MEDIUM

This is a National Phase Application filed under 35 U.S.C. 371 as a national stage of PCT/JP2021/030440, filed Aug. 19, 2021, and application claiming the benefit of Japanese Application No. 2020-150426, filed Sep. 8, 2020, the content of each of which is hereby incorporated by reference in its entirety.

TECHNICAL FIELD

The present disclosure relates to a peripheral edge processing apparatus, a peripheral edge processing method, and a computer-readable recording medium.

BACKGROUND

Patent Document 1 discloses a peripheral edge exposure apparatus. The peripheral edge exposure apparatus executes a process of detecting a displacement of an edge position of a substrate while rotating the substrate once, and a process of exposing a peripheral edge portion of a resist film formed on a surface of the substrate while rotating the substrate and moving the substrate in a radial direction of the substrate according to the displacement.

PRIOR ART DOCUMENT

Patent Document

Patent Document 1: Japanese Laid-Open Patent Publication No. 04-072614

The present disclosure provides some embodiments of a peripheral edge processing apparatus, a peripheral edge processing method, and a computer-readable recording medium, which are capable of processing a peripheral edge portion of a film with high precision.

SUMMARY

According to an embodiment of the present disclosure, a peripheral edge processing apparatus includes: a capturing part configured to capture a peripheral edge portion of a substrate, which includes a reference substrate and a workpiece substrate, so as to acquire a captured image of the reference substrate and a captured image of the workpiece substrate; a first calculation part configured to calculate a theoretical peripheral edge position of the reference substrate in the captured image of the reference substrate with reference to a center of the reference substrate; a second calculation part configured to calculate a theoretical peripheral edge position of the workpiece substrate in the captured image of the workpiece substrate based on the theoretical peripheral edge position of the reference substrate and the captured image of the workpiece substrate; a setting part configured to set processing parameters for the peripheral edge portion of the substrate based on the theoretical peripheral edge position of the workpiece substrate; and a processing part configured to process the peripheral edge portion of the substrate based on the processing parameters.

According to a peripheral edge processing apparatus, a peripheral edge processing method, and a computer-readable recording medium of the present disclosure, it is possible to process a peripheral edge portion of a film with high precision.

DETAILED DESCRIPTION

Figure 1:
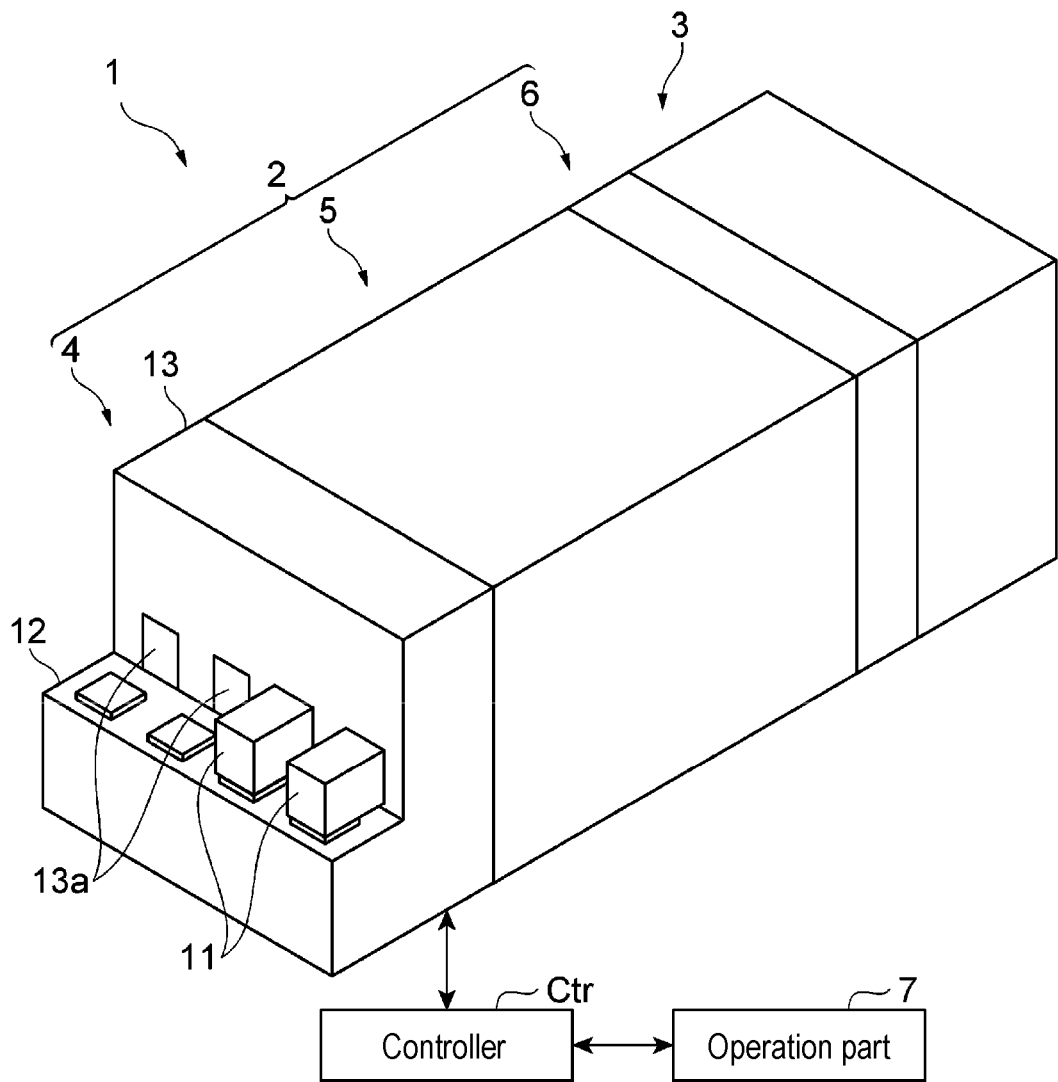
FIG. 1 is a perspective view showing an example of a substrate processing system.

In the following description, the same elements, or elements having the same functions will be designated by the same reference numerals, and redundant description thereof will be omitted.

[Substrate Processing System]

First, a configuration of a substrate processing system 1 will be described with reference to FIGS. 1 and 2. The substrate processing system 1 includes a coating-developing apparatus (peripheral edge processing apparatus) 2, an exposure apparatus 3, a controller Ctr, and an operation part 7.

The exposure apparatus 3 is configured to exchange a substrate W with the coating-developing apparatus 2 and perform exposure processing (pattern exposure) on a resist film formed on a front surface Wa (see FIG. 3) of the substrate W (reference substrate or workpiece substrate). The exposure apparatus 3 may selectively irradiate an exposure target portion of the resist film with an energy beam by, for example, a method such as liquid immersion exposure or the like.

The coating-developing apparatus 2 is configured to form a film R such as a resist film R2 (see FIG. 3) or the like on the front surface Wa of the substrate W before the exposure processing by the exposure apparatus 3. The coating-developing apparatus 2 is configured to perform a developing processing on the resist film R2 after the exposure processing.

The substrate W may have a disk shape, or may have a plate shape other than a circular shape, such as a polygonal shape or the like. The substrate W may have a cutout portion which is partially cut out. The cutout portion may be, for example, a notch (U-shaped or V-shaped groove, or the like) or a linear portion extending linearly (so-called orientation flat). The substrate W may be, for example, a semiconductor substrate (silicon wafer), a glass substrate, a mask substrate, an FPD (Flat Panel Display) substrate, or other various substrates. The diameter of the substrate W may be, for example, approximately 200 mm to 450 mm. The substrate W includes a captured image of a reference substrate W0 that serves as a reference for subsequent substrate processing, and a workpiece substrate W1 that is an actual processing target.

Figure 2:
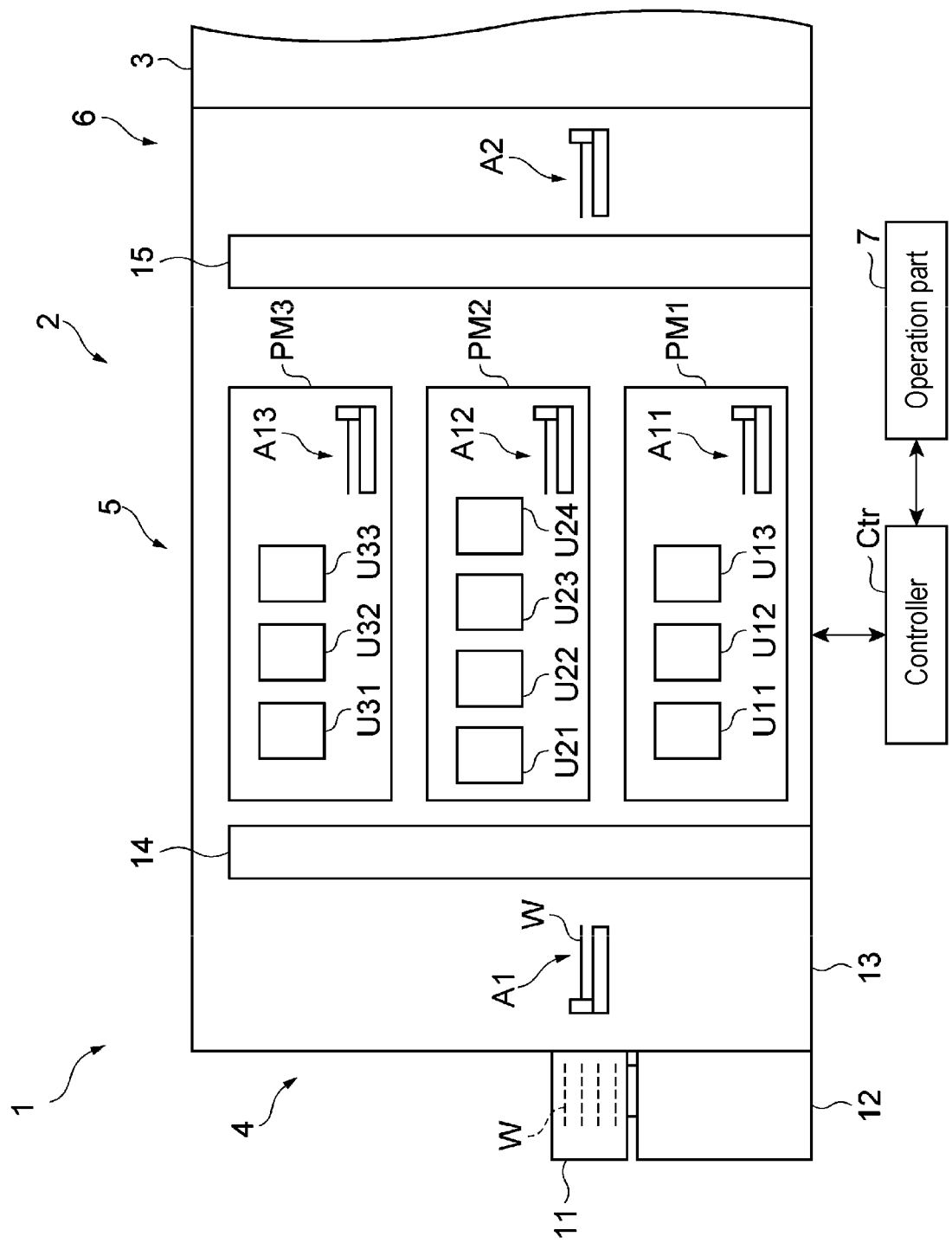
FIG. 2 is a side view schematically showing an interior of the substrate processing system shown in FIG. 1.

As shown in FIGS. 1 and 2, the coating-developing apparatus 2 includes a carrier block 4, a processing block 5, and an interface block 6. For example, the carrier block 4, the processing block 5 and the interface block 6 may be arranged side by side in a line in a horizontal direction.

The carrier block 4 includes a carrier station 12 and a loading/unloading part 13. The carrier station 12 detachably supports a plurality of carriers (containers) 11. The carrier 11 is configured to hermetically accommodate at least one substrate W (see FIG. 2). The carrier 11 includes an opening/closing door for loading and unloading the substrate W.

Figure 3:
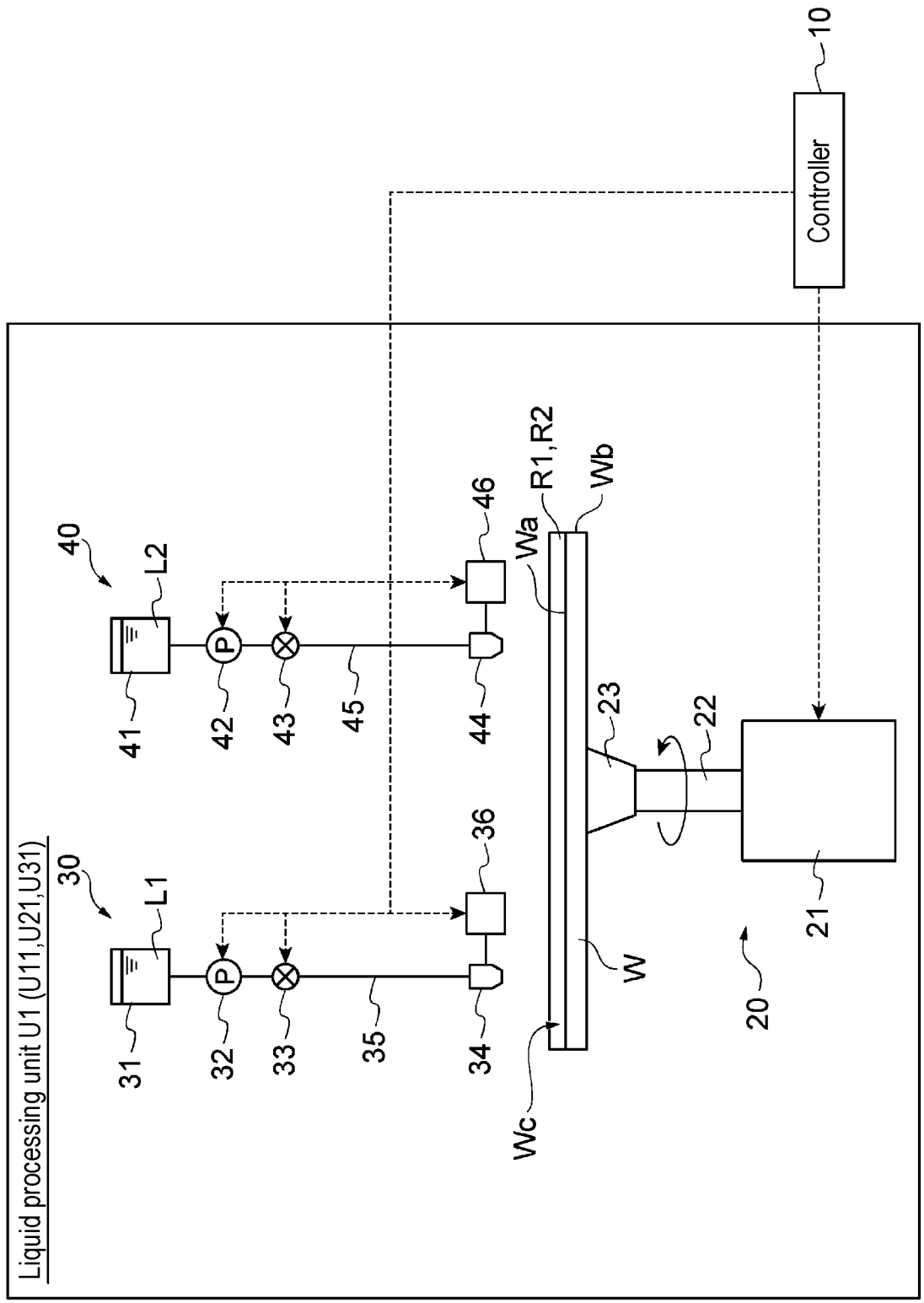
FIG. 3 is a side view schematically showing an example of a liquid processing unit.

The loading/unloading part 13 is located between the carrier station 12 and the processing block 5. The loading/unloading part 13 includes a plurality of opening/closing doors. While the carrier 11 is placed on the carrier station 12, the opening/closing door of the carrier 11 and the opening/closing door of the loading/unloading part 13 are opened to allow the interior of the carrier 11 and the interior of the loading/unloading part 13 to be in communication with each other. As shown in FIGS. 2 and 3, the loading/unloading part 13 incorporates a transfer arm A1. The transfer arm A1 is configured to take out the substrate W from the carrier 11 to transfer the same to the processing block 5, and is configured to receive the substrate W from the processing block 5 to return the same into the carrier 11.

As shown in FIG. 2, the processing block 5 includes processing modules PM1 to PM3.

The processing module PM1 is configured to form an underlayer film R1 (film) (see FIG. 3) on the front surface Wa of the substrate W. The processing module PM1 includes a liquid processing unit U11, a heat treatment unit U12, an inspection unit U13, and a transfer arm A11 configured to transfer the substrate W among the liquid processing unit U11, the thermal processing unit U12 and the inspection unit U13. For example, the liquid processing unit U11 may be configured to coat the substrate W with a coating liquid for forming the underlayer film. For example, the heat treatment unit U12 may be configured to perform a heat treatment for curing the coating film formed on the substrate W by the liquid processing unit U11 to form the underlayer film R1. Examples of the underlayer film may include an antireflection (SiARC) film, an SOG (Spin-On-Glass) film, an SOC (Spin-On-Carbon) film, an amorphous carbon film, and the like. For example, the inspection unit U13 may be configured to inspect respective surfaces (the front surface Wa, an end surface Wb, and a peripheral edge portion Wc) (see FIG. 3, and the like) of the substrate W on which the underlayer film R1 is formed.

The processing module PM2 is configured to form a resist film R2 on the underlayer film R1. The processing module PM2 includes a liquid processing unit U21, a heat treatment unit U22, an inspection unit U23, a peripheral edge exposure unit (processing part) U24, and a transfer arm A12 configured to transfer the substrate W among the liquid processing unit U21, the heat treatment unit U22, the inspection unit U23 and the peripheral edge exposure unit U24. For example, the liquid processing unit U21 may be configured to coat the substrate W with a coating liquid for forming a resist film. For example, the heat treatment unit U22 may be configured to perform a heat treatment (PAB: Pre-Applied Bake) for curing the coating film formed on the substrate W by the liquid processing unit U21 to form a resist film R2. For example, the inspection unit U23 may be configured to inspect respective surfaces (the front surface Wa, the end surface Wb, and the peripheral edge portion Wc) (see FIG. 3, and the like) of the substrate W on which the resist film R2 is formed. The peripheral edge exposure unit U24 may be configured to expose a portion of the resist film R2, which is formed on the peripheral edge portion We of the substrate W.

The processing module PM3 is configured to develop the exposed resist film R2. The processing module PM3 includes a liquid processing unit U31, a heat treatment unit U32, an inspection unit U33, and a transfer arm A13 configured to transfer the substrate W among the liquid processing unit U31, the heat treatment unit U32 and the inspection unit U33. For example, the liquid processing unit U31 may be configured to partially remove the resist film R2 to form a resist pattern (not shown). For example, the heat treatment unit U32 may be configured to perform a heat treatment before development (PEB: Post Exposure Bake), a heat treatment after development (PB: Post Bake), and the like. For example, the inspection unit U33 may be configured to inspect respective surfaces (the front surface Wa, the end surface Wb, and the peripheral edge portion Wc) (see FIG. 3, and the like) of the substrate W on which the resist pattern is formed.

As shown in FIG. 2, the processing block 5 includes a shelf unit 14 located near the carrier block 4 and a shelf unit 15 located near the interface block 6. The shelf unit 14 is configured to mediate the transfer of the substrate W between the loading/unloading part 13 and the processing modules PM1 to PM3. The shelf unit 15 is configured to mediate the transfer of substrate W between the processing modules PM1 to PM3 and the interface block 6.

The interface block 6 incorporates a transfer arm A2 and is arranged between the processing block 5 and the exposure apparatus 3. The transfer arm A2 is configured to take out the substrate W from the shelf unit 15 to transfer the same to the exposure apparatus 3, and is configured to receive the substrate W from the exposure apparatus 3 and return the same to the shelf unit 15.

The controller Ctr is configured to partially or entirely control the coating-developing apparatus 2. Details of the controller Ctr will be described later. The controller Ctr may be configured to transmit and receive signals to and from the controller of the exposure apparatus 3 and control the substrate processing system 1 entirely in cooperation with the controller of the exposure apparatus 3.

The operation part 7 is an input device that receives operations performed by an operator (worker). The operation part 7 may include, for example, a mouse, a keyboard, and a display that displays an operation screen for operation. Each element of the operation part 7 is communicably connected to the controller Ctr. One computer device may be configured with the operation part 7 and the controller Ctr. The operation part 7 outputs input information indicating the content of operations input by the operator to the controller Ctr.

[Liquid Processing Unit]

Next, the liquid processing units (processing parts) U11, U21 and U31 will be described in more detail with reference to FIG. 3. Since the liquid processing units U11, U21 and U31 have the same configuration, they may be collectively referred to as "liquid processing unit U1" hereinafter. The liquid processing unit U1 includes a rotary holding part (holder) 20, a liquid supply part 30, and a liquid supply part (supplier) 40.

The rotary holding part 20 includes a rotating part 21, a shaft 22 and a holder 23. The rotating part 21 operates based on an operation signal from the controller Ctr to rotate the shaft 22. The rotating part 21 may be, for example, a power source such as an electric motor or the like. The holder 23 is provided at the distal end portion of the shaft 22. The substrate W may be placed on the holder 23. The holder 23 is configured to hold the substrate W substantially horizontally by attraction or the like. That is, the rotary holding part 20 rotates the substrate W about a central axis (rotational axis) perpendicular to the front surface Wa of the substrate W in a state in which the posture of the substrate W is substantially horizontal. In the example shown in FIG. 3, the rotary holding part 20 rotates the substrate W at a predetermined rotational speed counterclockwise when viewed from above.

The liquid supply part 30 is configured to supply a processing liquid L1 to the front surface Wa of the substrate W. In the processing module PM1, the processing liquid L1 is a coating liquid for forming the underlayer film R1. In the processing module PM2, the processing liquid L1 is a resist liquid for forming the resist film R2. In the processing module PM3, the processing liquid L1 is a developing agent. The resist material contained in the resist liquid may be a positive resist material or a negative resist material. The positive resist material is a resist material in which a pattern-exposed portion dissolves and a pattern-unexposed portion (light-shielding portion) remains. The negative resist material is a resist material in which a pattern-unexposed portion (light-shielding portion) dissolves and a pattern-exposed portion remains.

The liquid supply part 30 includes a liquid source 31, a pump 32, a valve 33, a nozzle 34, a pipe 35 and a drive mechanism 36. The liquid source 31 functions as a source of the processing liquid L1. The pump 32 operates based on an operation signal from the controller 10, sucks the processing liquid L1 from the liquid source 31, and delivers the same to the nozzle 34 via the pipe 35 and the valve 33.

The nozzle 34 is arranged above the substrate W so that a discharge port thereof faces the front surface Wa of the substrate W. The nozzle 34 is configured to discharge the processing liquid L1 sent from the pump 32 onto the front surface Wa of the substrate W. The liquid source 31, the pump 32, the valve 33, and the nozzle 34 are arranged on the pipe 35 sequentially from the upstream side. The drive mechanism 36 is configured to operate based on a signal from the controller Ctr and move the nozzle 34 horizontally and vertically.

The liquid supply part 40 is configured to supply a processing liquid L2 to the front surface Wa of the substrate W. In the processing module PM1, the processing liquid L2 is a chemical liquid (for example, organic solvent) for removing the peripheral edge portion of the underlayer film R1. In the processing module PM2, the processing liquid L2 is a chemical liquid (for example, organic solvent, or developing agent) for removing the peripheral edge portion of the resist film R2. In the processing module PM3, the processing liquid L2 is a rinse liquid.

The liquid supply part 40 includes a liquid source 41, a pump 42, a valve 43, a nozzle 44, a pipe 45 and a drive mechanism 46. The liquid source 41 functions as a source of the processing liquid L2. The pump 42 sucks the processing liquid L2 from the liquid source 41 and sends the same to the nozzle 44 via the pipe 45 and the valve 43.

The nozzle 44 is arranged above the substrate W so that a discharge port thereof faces the front surface Wa of the substrate W. The nozzle 44 may discharge the processing liquid L2 sent from the pump 42 onto the front surface Wa of the substrate W. The liquid source 41, the pump 42, the valve 43, and the nozzle 44 are arranged on the pipe 45 sequentially from the upstream side. The drive mechanism 46 is configured to operate based on an operation signal from the controller Ctr to move the nozzle 44 horizontally and vertically.

For example, the drive mechanism 46 may move the nozzle 44 along a radial direction of the substrate W held substantially horizontally on the holder 23 when viewed from above. In this case, a liquid landing position of the processing liquid L2 is changed in the radial direction of the substrate W. That is, a removal width of the peripheral edge portion of the film removed by the processing liquid L2 is changed. As a result, an edge position of the film is changed after the peripheral edge portion is removed.

[Inspection Unit]

Figure 4:
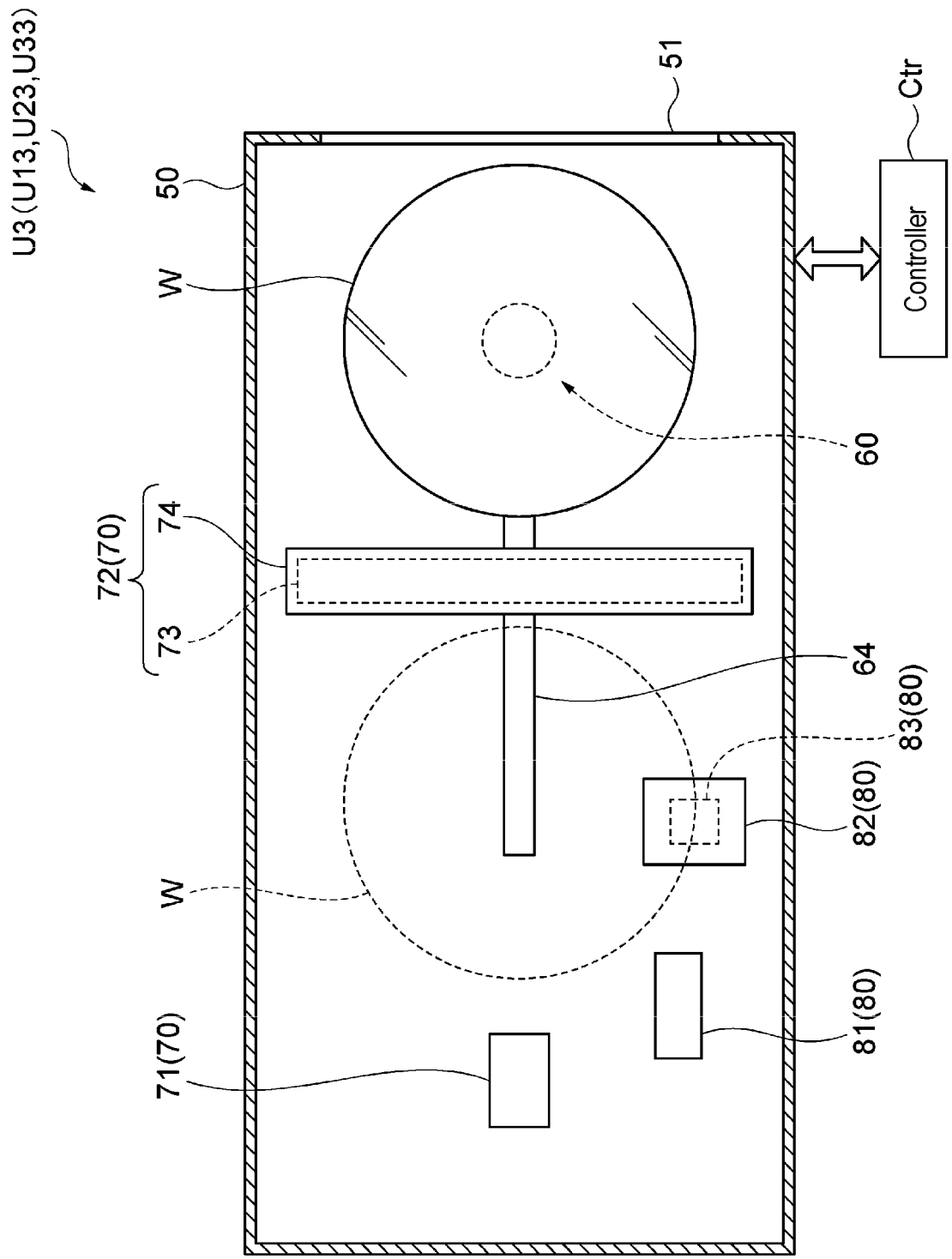
FIG. 4 is a top view schematically showing an example of an inspection unit.
Figure 5:
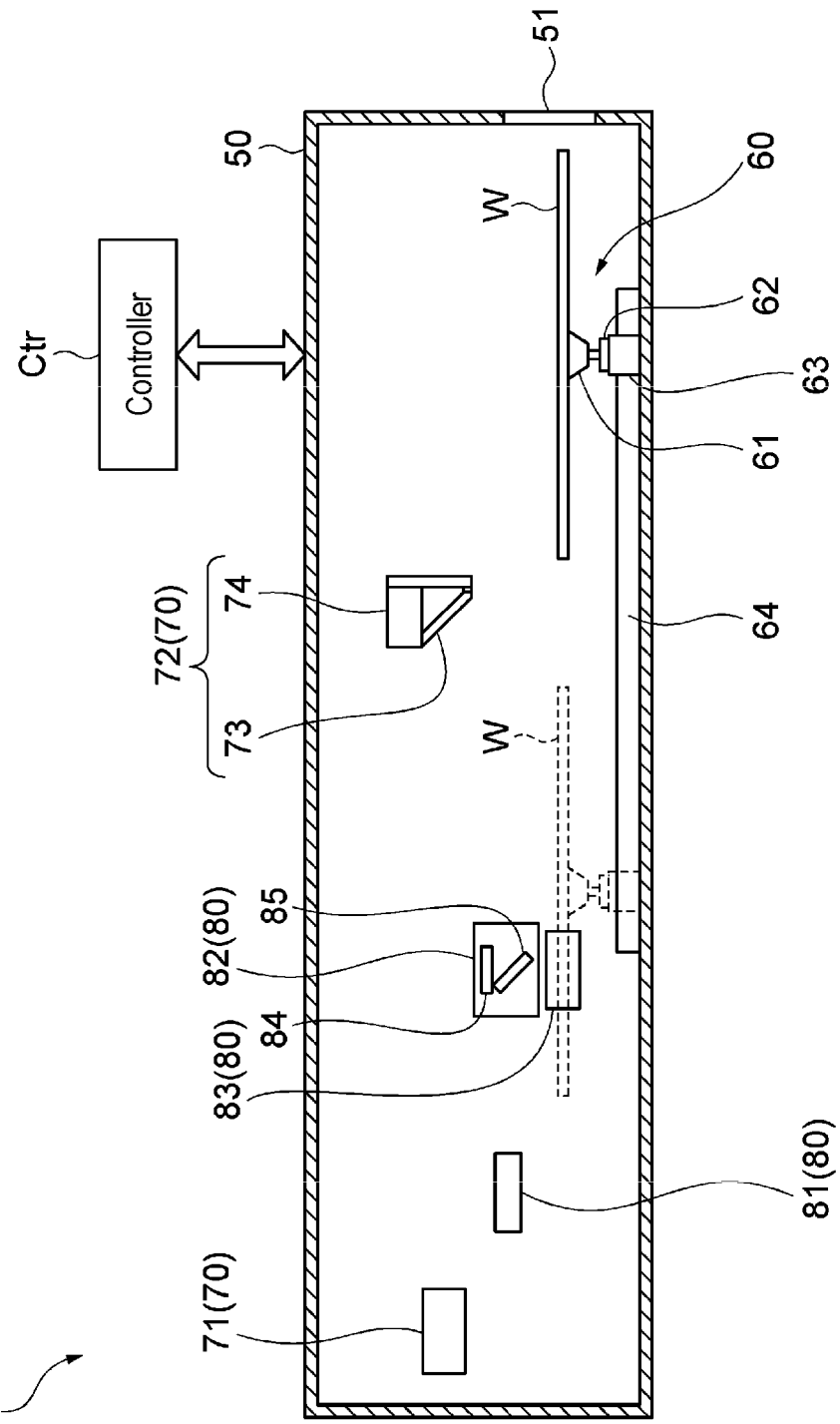
FIG. 5 is a side view schematically showing the inspection unit shown in FIG. 4.

Next, the inspection units (capturing parts) U13, U23 and U33 will be described in more detail with reference to FIGS. 4 and 5. Since the inspection units U13, U23 and U33 have the same configuration, they may be collectively referred to as "inspection unit U3" hereinafter. The inspection unit U3 includes a housing 50, a rotary holding subunit 60, a surface capturing subunit 70, and a peripheral edge capturing subunit 80. These subunits are arranged inside the housing 50. One end wall of the housing 50 is formed with a loading/unloading port 51 for loading the substrate W into the housing 50 and unloading the substrate W from the housing 50.

The rotary holding subunit 60 includes a holding table 61, drive mechanisms 62 and 63 and a guide rail 64. The holding table 61 is, for example, an attraction chuck that holds the substrate W substantially horizontally by attraction or the like.

The drive mechanism 62 is, for example, an electric motor, and is configured to rotationally drive the holding table 61. That is, the drive mechanism 62 rotates the substrate W held by the holding table 61. The drive mechanism 62 may include an encoder for detecting a rotational position (rotational angle) of the holding table 61. In this case, a capturing position of the substrate W captured by the surface capturing subunit 70 and the peripheral edge capturing subunit 80 may be associated with the rotational position of the substrate W. in a case in which the substrate W has a cutout portion, the posture of the substrate W may be specified based on the cutout portion determined by the surface capturing subunit 70 and the peripheral edge capturing subunit 80 and the rotational position detected by the encoder.

The drive mechanism 63 is, for example, a linear actuator, and is configured to move the holding table 61 along the guide rail 64. That is, the drive mechanism 63 transfers the substrate W held on the holding table 61 between one end side and the other end side of the guide rail 64. Therefore, the substrate W held by the holding table 61 is movable between a first position close to the loading/unloading port 51 and a second position close to the peripheral edge capturing subunit 80. The guide rail 64 extends linearly (for example, rectilinearly) within the housing 50.

The surface capturing subunit 70 includes a camera 71 and an illumination module 72. The camera 71 includes a lens and one capturing element (for example, CCD image sensor, CMOS image sensor, or the like). The camera 71 faces the illumination module 72 in the horizontal direction. That is, the camera 71 and the illumination module 72 are arranged horizontally. The camera 71 and the illumination module 72 may be arranged side by side along an extension direction of the guide rail 64.

The illumination module 72 includes a half mirror 73 and a light source 74. The half mirror 73 is arranged inside the housing 50 at an angle of approximately 45 degrees with respect to the horizontal direction. The half mirror 73 is positioned above an intermediate portion of the guide rail 64. The half mirror 73 has a rectangular shape and extends so as to intersect the extension direction of the guide rail 64 when viewed from above. A length of the half mirror 73 is set to be larger than a diameter of the substrate W.

The light source 74 is positioned above the half mirror 73. Light emitted from the light source 74 totally passes through the half mirror 73 and is irradiated downward (toward the guide rail 64). The light passing through the half mirror 73 is reflected at an object located below the half mirror 73, is reflected again at the half mirror 73, passes through the lens of the camera 71, and is incident on the capturing element of the camera 71. That is, the camera 71 may capture an image of an object existing in the irradiation region of the light source 74 via the half mirror 73. For example, when the holding table 61 holding the substrate W is moved along the guide rail 64 by the drive mechanism 63, the camera 71 may capture an image of the front surface Wa of the substrate W passing through the irradiation region of the light source 74. Data on the image captured by the camera 71 is transmitted to the controller Ctr.

The peripheral edge capturing subunit 80 includes a camera 81, an illumination module 82, and a mirror member 83. The camera 81 includes a lens and one capturing element (for example, CCD image sensor, CMOS image sensor, or the like). The camera 81 faces the illumination module 82 in the horizontal direction. That is, the camera 81 and the illumination module 82 are arranged side by side in the horizontal direction.

The illumination module 82 is arranged above the substrate W held by the holding table 61. The illumination module 82 includes a light source 84 and a half mirror 85. As shown in FIG. 5, the half mirror 85 is arranged at an angle of approximately 45 degrees with respect to the horizontal direction. The mirror member 83 is arranged below the illumination module 82 as shown in FIGS. 4 and 5. The mirror member 83 includes a main body composed of an aluminum block, and a reflective surface.

When the substrate W held by the holding table 61 is positioned at the second position, the reflective surface of the mirror member 83 faces the end surface Wb of the substrate W held by the holding table 61 and the peripheral edge portion We at the side of the rear surface of the substrate W. The reflective surface of the mirror member 83 is inclined with respect to the rotation axis of the holding table 61. The reflective surface of the mirror member 83 is subjected to mirror-like finishing. For example, the reflective surface may have a mirror sheet attached thereto, may be an aluminum-plated surface, or may have an aluminum material vapor-deposited thereon. This reflective surface is a curved surface depressed radially outward of the substrate W held by the holding table 61.

In the illumination module 82, light emitted from the light source 84 totally passes through the half mirror 85 and is irradiated downward. A portion of the light that has passed through the half mirror 85 is reflected at the peripheral edge portion We of the substrate W on the side of the front surface Wa. The reflected light does not face the reflective surface of the mirror member 83, but is further reflected at the half mirror 85 and then incident on the capturing element of the camera 81.

On the other hand, another portion of the light that has passed through the half mirror 85 is reflected at the reflective surface of the mirror member 83 located below the half mirror 85. When the substrate W held by the holding table 61 is positioned at the second position, the reflected light reflected at the reflective surface of the mirror member 83 is mainly reflected at the end surface Wb of the substrate W. The reflected light is sequentially reflected at the reflective surface of the mirror member 83 and the half mirror 85, and is incident on the capturing element of the camera 81.

In this way, the reflected light from the peripheral edge portion Wd of the substrate W and the reflected light from the end surface Wb of the substrate W are incident on the capturing element of the camera 81 via different optical paths. That is, when the substrate W held by the holding table 61 is positioned at the second position, the camera 81 captures images of both the peripheral edge portion We of the front surface Wa of the substrate W and the end surface Wb of the substrate W to generate a captured image of the peripheral edge portion We of the front surface Wa and a captured image of the end surface Wb. Data on the images captured by the camera 81 is transmitted to the controller Ctr.

[Peripheral Edge Exposure Unit]

Figure 6:
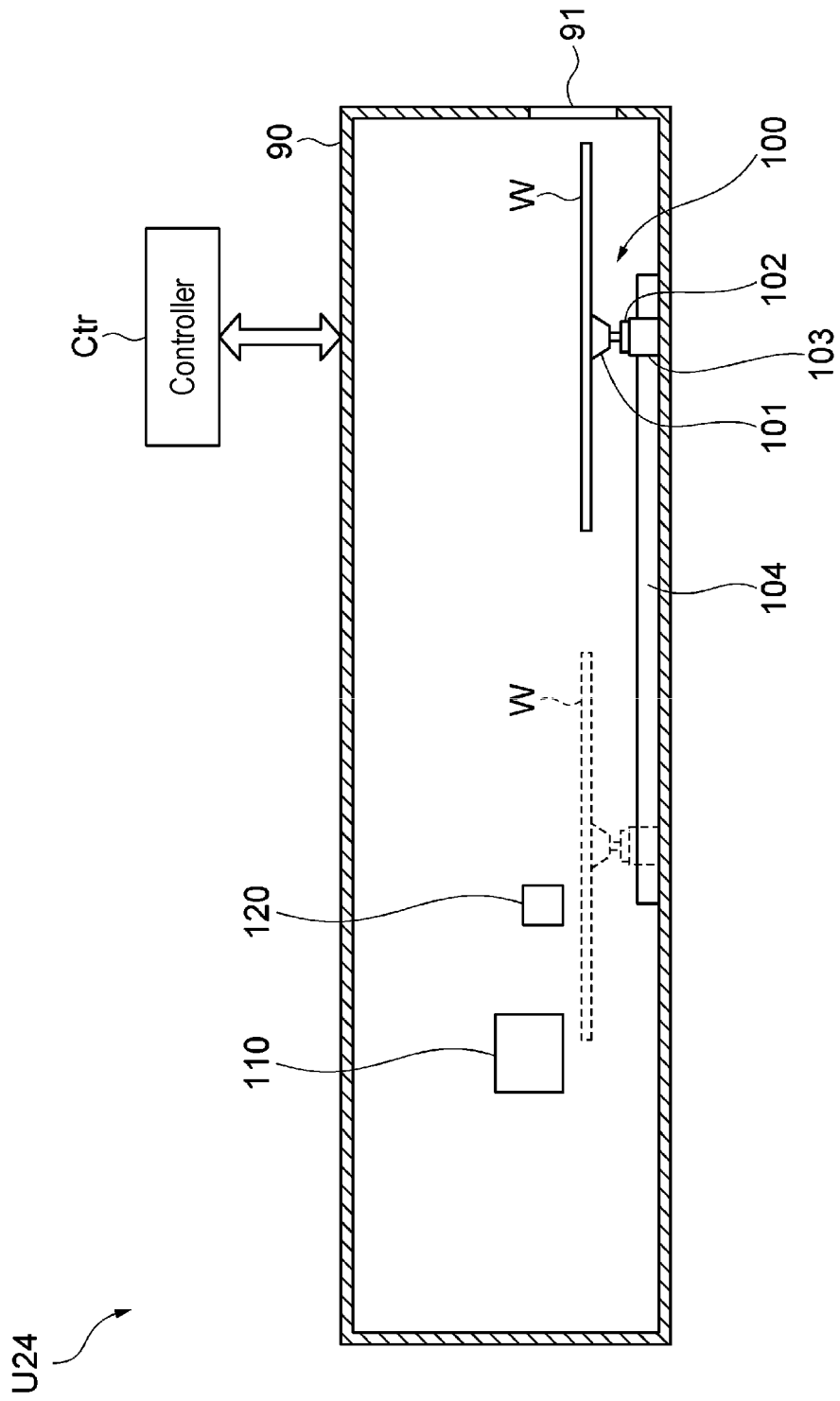
FIG. 6 is a side view schematically showing an example of a peripheral edge exposure unit.

Next, the peripheral edge exposure unit U24 will be described in more detail with reference to FIGS. 6 to 8. As shown in FIG. 6, the peripheral edge exposure unit U24 includes a housing 90, a rotary holding subunit (holder) 100, an exposure subunit (peripheral edge exposing part) 110, and an eccentricity detection subunit (detector) 120. These subunits are located inside the housing 90. One end wall of the housing 90 is formed with a loading/unloading port 91 for loading the substrate W into the housing 90 and unloading the substrate W from the housing 90.

Figure 7:
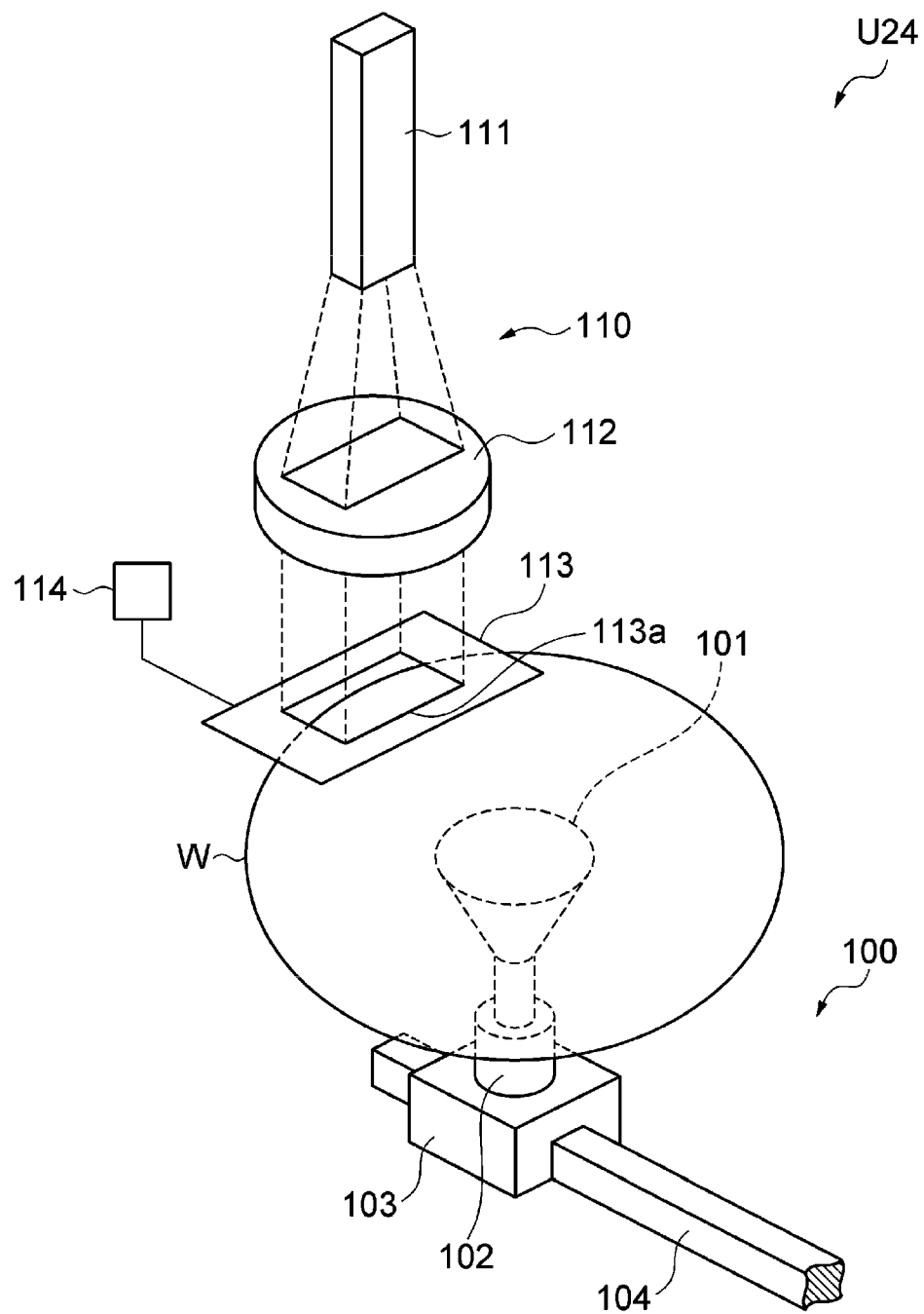
FIG. 7 is a perspective view schematically showing an example of an exposure subunit.
Figure 8:
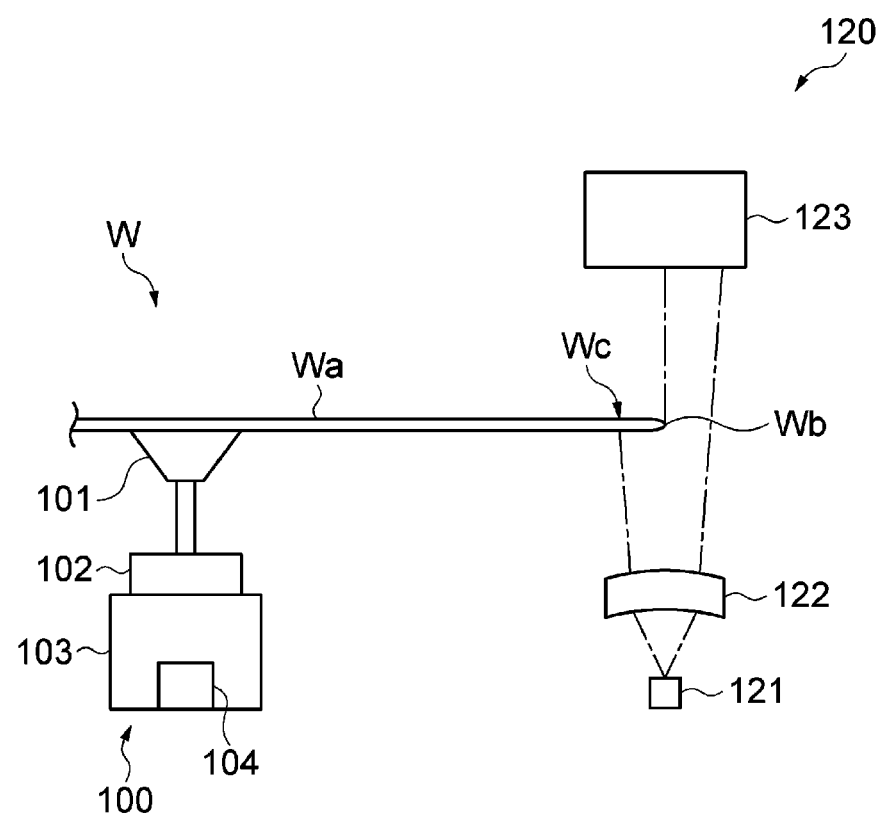
FIG. 8 is a side view schematically showing an example of an eccentricity detection subunit.

The rotary holding subunit 100 includes a holding table 101, drive mechanisms 102 and 103, and a guide rail 104, as shown in FIGS. 6 to 8. The holding table 101 is, for example, an attraction chuck that holds the substrate W substantially horizontally by attraction or the like.

The drive mechanism 102 is, for example, an electric motor, and is configured to rotationally drive the holding table 101. That is, the drive mechanism 102 rotates the substrate W held on the holding table 101. The drive mechanism 102 may include an encoder for detecting a rotational position of the holding table 101. In this case, an exposure position of the substrate W exposed by the exposure subunit 110 and a detection position of the substrate W detected by the eccentricity detection subunit 120 may be associated with a rotational position of the substrate W.

The drive mechanism 103 is, for example, a linear actuator, and is configured to move the holding table 101 along the guide rail 104. That is, the drive mechanism 103 transfers the substrate W held on the holding table 101 between one end side and the other end side of the guide rail 104. Therefore, the substrate W held by the holding table 101 may be moved between a first position close to the loading/unloading port 91 and a second position close to the exposure subunit 110. The guide rail 104 extends linearly (for example, rectilinearly) within the housing 90.

The exposure subunit 110 is located above the rotary holding subunit 100, as shown in FIGS. 6 and 7. The exposure subunit 110 includes a light source 111, an optical system 112, a mask 113, and a drive mechanism 114, as shown in FIG. 7. The light source 111 irradiates energy rays (for example, ultraviolet rays) containing a wavelength component capable of exposing the resist film R2 downward (toward the holding table 101). The light source 111 may be, for example, an ultra-high pressure UV lamp, a high pressure UV lamp, a low pressure UV lamp, an excimer lamp, or the like.

The optical system 112 is positioned below the light source 111. The optical system 112 is constituted with at least one lens. The optical system 112 converts light emitted from the light source 111 into substantially parallel light and irradiates the mask 113 with the parallel light. The mask 113 is positioned below the optical system 112. The mask 113 has an opening 113a for adjusting an exposure area. The parallel light from the optical system 112 passes through the opening 113a and is incident on the peripheral edge portion We of the front surface Wa of the substrate W held on the holding table 101. As the developing agent in the liquid processing unit U31 is supplied to the resist film R2 whose peripheral edge portion is exposed, the peripheral edge portion is removed.

The drive mechanism 114 is connected to the mask 113. The drive mechanism 114 is operated based on an operation signal from the controller Ctr, and is configured to move the mask 113 in the horizontal direction (for example, in the radial direction of the substrate W as viewed from above). As the mask 113 is horizontally moved by the drive mechanism 114, the exposure width of the peripheral edge portion We of the substrate W is changed.

The eccentricity detection subunit 120 includes a light projector 121, an optical system 122, and a light receiver 123, as shown in FIG. 8. The eccentricity detection subunit 120 may be arranged near the peripheral edge portion We of the substrate W when the substrate W held by the holding table 101 is at the second position near the exposure subunit 110. For example, the light projector 121, the optical system 122, the peripheral edge portion We of the substrate W, and the light receiver 123 are vertically arranged in the named order so that the peripheral edge portion We of the substrate W held by the holding table 101 is positioned between the light projector 121 and the optical system 122, and the light receiver 123.

The light projector 121 is configured to emit light toward the optical system 122 and the light receiver 123. The optical system 122 is constituted with at least one lens. The optical system 122 converts the light from the light projector 121 into substantially parallel light and irradiates the light receiver 123 with the parallel light. The light receiver 123 is, for example, a CCD image sensor, and is configured to output information about a light-receiving status to the controller Ctr. When the peripheral edge portion We of the substrate W is positioned between the light projector 121 and the optical system 122, and the light receiver 123, the light from the light projector 121 is blocked. Therefore, the controller Ctr may detect a peripheral edge position of the substrate W based on the light blocking position. An optical path length (capturing distance) from the light receiver 123 to the substrate W in the eccentricity detection subunit 120 is set to be shorter than an optical path length (capturing distance) from the camera 71 to the substrate W in the surface capturing subunit 70.

The eccentricity detection subunit 120 may detect the edge position of the substrate W at, for example, each of 360 measurement positions set by changing the angle by 1 degrees from a reference position (for example, position of the cutout portion) in the circumferential direction. When the substrate W is placed eccentrically with respect to the holding table 101, the position of the peripheral edge of the substrate W is changed when the substrate W rotates once by the rotary holding subunit 100. Therefore, the controller Ctr may calculate an eccentricity amount of the substrate W with respect to the holding table 101 based on the change in the peripheral edge position of the substrate W.

[Function of Controller]

Figure 9:
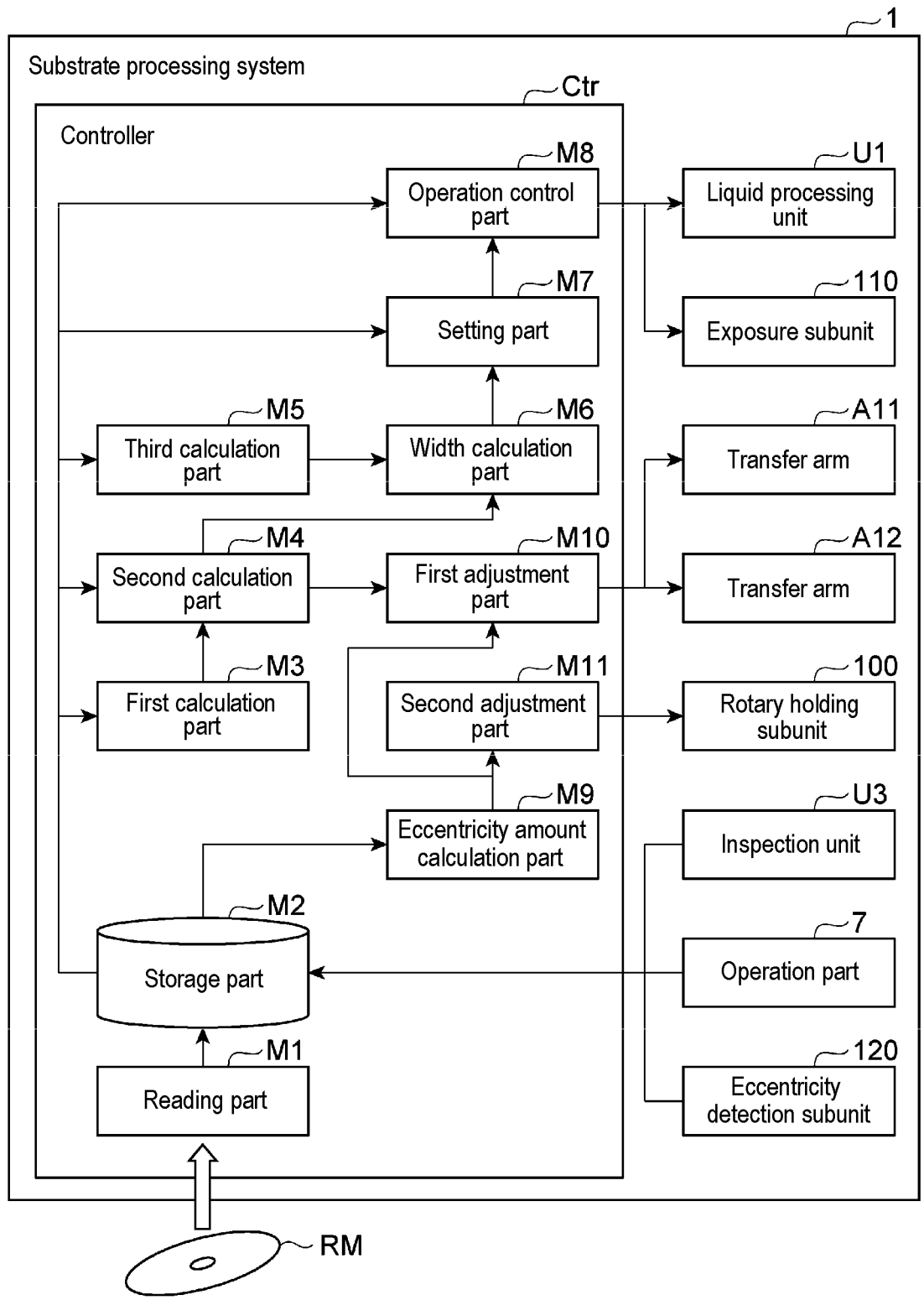
FIG. 9 is a block diagram showing an example of a main part of the substrate processing system.

As shown in FIG. 9, the controller Ctr includes, as functional modules, a reading part M1, a storage part M2, a first calculation part M3, a second calculation part M4, and a third calculation part M5. As shown in FIG. 9, the controller Ctr includes, as functional modules, a width calculation part M6, a setting part M7, an operation control part M8, an eccentricity amount calculation part M9, a first adjustment part M10, and a second adjustment part M11. These functional modules are merely defined by dividing the functions of the controller Ctr into a plurality of modules for the sake of convenience in description and do not necessarily mean that hardware constituting the controller Ctr is divided into such modules. Each functional module is not limited to being implemented by executing a program, but may be implemented by a dedicated electric circuit (for example, a logic circuit) or an integrated circuit (ASIC: Application Specific Integrated Circuit) that integrates the dedicated electric circuit.

The reading part M1 is configured to read a program from a computer-readable recording medium RM. The recording medium RM records a program for operating each part in the substrate processing system 1. The recording medium RM may be, for example, a semiconductor memory, an optical recording disk, a magnetic recording disk, or a magneto-optical recording disk.

The storage part M2 is configured to store various pieces of data. The storage part M2 stores, for example, a program read from the recording medium RM by the reading part M1, various pieces of data for processing the peripheral edge portion of the film R, and the like. The storage part M2 stores, for example, input information input by the operator via the operation part 7, various pieces of data on the captured images obtained from the inspection unit U3, data on the peripheral edge position of the substrate W detected by the eccentricity detection subunit 120, and the like. Various pieces of data on the captured images obtained from the inspection unit U3 include a captured image of the reference substrate W0 and a captured image of the workpiece substrate W1.

The first calculation part M3 is configured to calculate a theoretical peripheral edge position Er1 (see the dashed line shown in FIG. 10A) (hereinafter sometimes simply referred to as "peripheral edge position Er1") of the reference substrate W0. As used herein, the expression "theoretical peripheral edge position" is different from an actual peripheral edge position of the substrate W, and refers to a theoretical peripheral edge position based on a design dimension d1 of the radius of the substrate W. The design dimension d1 of the radius of the substrate W may be, for example, 150 mm. The actual peripheral edge position of the substrate W may differ from the design dimension d1 due to, for example, individual variations in each substrate W, an error occurring during the processing of the peripheral edge portion We of the substrate W, or the like. Therefore, the actual peripheral edge position of one substrate W and the actual peripheral edge position of another substrate W may vary. In contrast, the theoretical peripheral edge position is a virtual position that is not affected by such a variation.

The first calculation part M3 is configured to calculate the peripheral edge position Er1 in the captured image of the reference substrate W0 with reference to the center of the reference substrate W0. The peripheral edge position Er1 is indicated by, for example, pixel coordinates from the origin O of the image data. A reference marker RP (for example, pattern, scale, mark, or the like) (see FIG. 10A) may be formed on the surface of the reference substrate W0 as an element for identifying a distance from the center of the reference substrate W0. A distance d2 mm from the center of the reference substrate W0 to the reference marker RP is measured in advance and known.

Figure 10A:
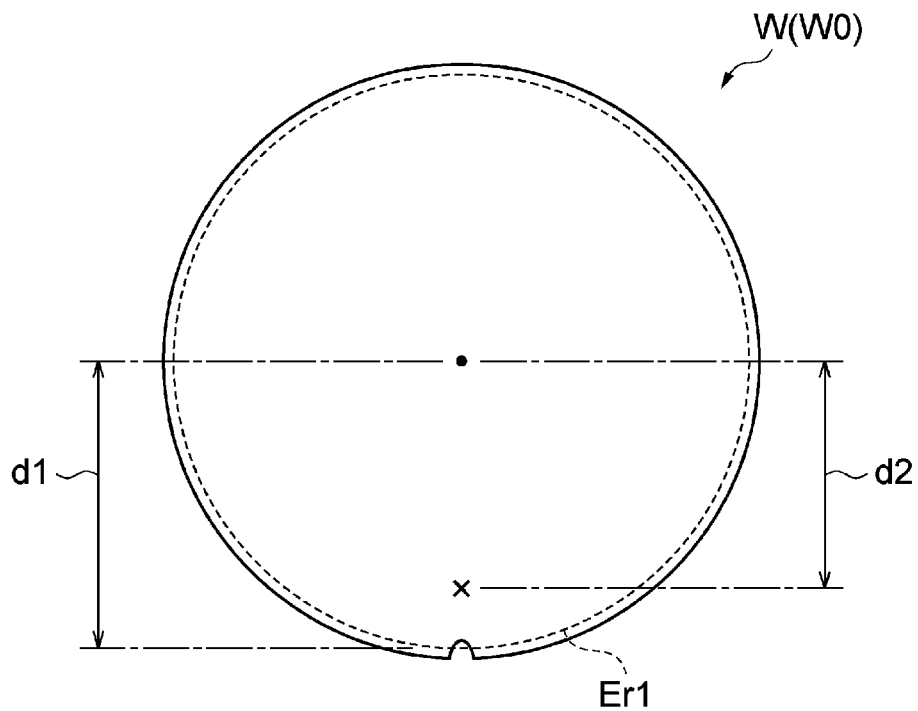
FIG. 10A is a schematic diagram showing an example of a reference marker formed on a surface of a reference substrate.
Figure 10B:
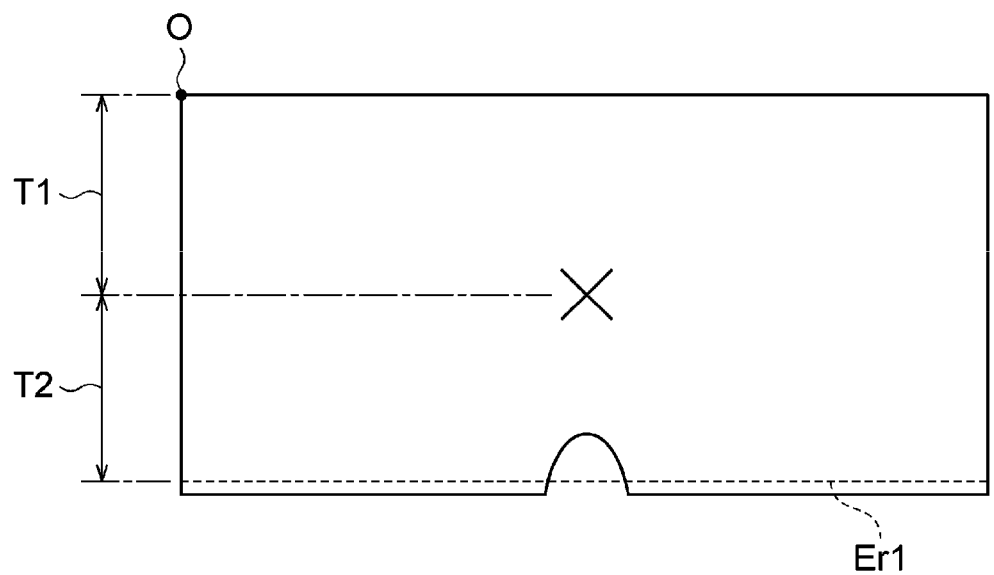
FIG. 10B is a schematic diagram showing an example of a captured image of a peripheral edge portion of the reference substrate.

As an example, the first calculation part M3 may be configured to perform a first process of calculating a position T1 (pixel coordinates) of the reference marker RP in the captured image of the reference substrate W0 (see FIG. 10B). The first calculation part M3 may be configured to perform a second process of calculating a difference between the design dimension d1 of the radius of the substrate W and an actual position (distance d2) of the reference marker RP as a size T2 in the captured image of the reference substrate W0 (see FIG. 10B). The first calculation part M3 may be configured to perform a third process of calculating the peripheral edge position Er1 in the captured image of the reference substrate W0 based on the position T1 and the size T2. The first calculation part M3 outputs the calculation result of the peripheral edge position Er1 to the second calculation part M4.

The second calculation part M4 is configured to calculate a theoretical peripheral edge position Er2 (see the broken line shown in FIG. 11) (hereinafter sometimes simply referred to as "peripheral edge position Er2") of the workpiece substrate W1 based on the peripheral edge position Er1 and the captured image of the workpiece substrate W1. The second calculation part M4 is configured to calculate the peripheral edge position Er2 in the captured image of the workpiece substrate W1.

As an example, the second calculation part M4 may be configured to perform a fourth process of calculating an actual peripheral edge position Ew (see FIG. 11) (hereinafter sometimes simply referred to as "peripheral edge position Ew") of the workpiece substrate W1 based on the captured image of the workpiece substrate W1. The second calculation part M4 may be configured to perform a fifth process of calculating an eccentricity state of the workpiece substrate W1 based on the peripheral edge position Ew. In the fifth process, an eccentricity amount A and an eccentricity angle α of the workpiece substrate W1 may be calculated as the eccentricity state. The second calculation part M4 may be configured to perform a sixth process of calculating the peripheral edge position Er2 in consideration of the eccentricity state of the process substrate W1. The peripheral edge positions Er2 and Ew are indicated by, for example, pixel coordinates from the origin O of the image data. The second calculation part M4 outputs the calculation result of the peripheral edge position Ew to the width calculation part M6. The second calculation part M4 outputs the eccentricity amount A to the first adjustment part M10.

The third calculation part M5 is configured to calculate an edge position Wf of the film (underlayer film R1, resist film R2, or the like) (see FIG. 11) (hereinafter sometimes simply referred to as "edge position Wf") formed on the front surface Wa of the workpiece substrate W1 based on the captured image of the workpiece substrate W1. The third calculation part M5 is configured to calculate the edge position Wf in the captured image of the workpiece substrate W1.

As an example, the third calculation part M5 may be configured to calculate the edge position Wf on the captured image by using a difference in brightness (contrast ratio) of the captured image of the workpiece substrate W1. The third calculation part M5 may calculate the edge position Wf at each of a plurality of measurement positions set along the circumferential direction of the substrate W. For example, the third calculation part M5 may calculate the edge position Wf at each of 360 measurement positions set by changing the angle by 1 degrees from the reference position (for example, position of the cutout portion) in the circumferential direction. The third calculation part M5 may calculate the edge position Wf based on the captured image of the workpiece substrate W1 by using an inspection recipe stored in the storage part M2. The third calculation part M5 outputs the calculation result of the edge position Wf to the width calculation part M6.

The width calculation part M6 is configured to calculate a width T3 (difference value) between the theoretical peripheral edge of the workpiece substrate W1 and the edge of the film R based on a difference between the peripheral edge position Er2 and the edge position Wf. The width calculation part M6 may be configured to calculate the width T3 according to an interval (the number of pixels) between the peripheral edge position Er2 and the edge position Wf in the captured image. The width calculation part M6 may calculate a removal width Wcut [mm] of the peripheral edge portion of the film R by multiplying the width T3 by the size per pixel [mm/pixel]. The width calculation part M6 outputs the calculated removal width Wcut to the setting part M7.

When the peripheral edge portion of the underlayer film R1 or the resist film R2 is removed in the liquid processing units U11 and U21, the removal width Wcut calculated by the width calculation part M6 is a size of the underlayer film R1 or the resist film R2 removed by the processing liquid L2. When the peripheral edge portion of the resist film R2 is removed in the peripheral edge exposure unit U24 and the liquid processing unit U31, the removal width Wcut calculated by the width calculation part M6 is a size of the peripheral edge portion of the resist film R2 removed by peripheral edge exposure and development.

The setting part M7 is configured to set processing parameters for the peripheral edge portion We of the substrate W based on the peripheral edge position Er2. The processing parameters may include, for example, a horizontal position of the nozzle 44 in the radial direction of the substrate W, a height position of the nozzle 44 from the substrate W, and the like. The processing parameters may include, for example, an angle of the nozzle 44 with respect to the substrate W, a discharge flow rate (supply amount) of the processing liquid L2 supplied from the nozzle 44, a horizontal position of the mask 113 in the radial direction of the substrate W, and the like. The setting part M7 may output the set processing parameters to the operation control part M8. When setting a new processing parameter, the setting part M7 may store the new processing parameter in the storage part M2 so as to overwrite the previous processing parameter.

As an example, the setting part M7 may be configured to set the processing parameter based on the removal width Wcut output from the width calculation part M6. As an example, the setting part M7 may be configured to set the processing parameter by comparing the removal width Wcut with a predetermined target value (for example, a target value of the removal width) stored in the storage part M2. For example, the setting part M7 may set various processing parameters so that a difference between the removal width Wcut and the target value is reduced in the substrate W to be processed next.

In a case in which the removal width Wcut exceeds the target value (a case in which the removal width Wcut is greater than the target value), when processing a subsequent substrate W, for example, the horizontal position of the nozzle 44 may be set to be located radially outward and the height position of the nozzle 44 may be set to be high. In the case in which the removal width Wcut exceeds the target value, when processing the subsequent substrate W, for example, the angle of the nozzle 44 may be set to be small so that the tip of the nozzle 44 faces radially outward and the discharge flow rate of the processing liquid L2 discharged from the nozzle 44 may be set to be small. In the case in which the removal width Wcut exceeds the target value, when processing the subsequent substrate W, for example, the horizontal position of the mask 113 may be set to be located radially outward.

In a case in which the removal width Wcut is less than the target value (case in which the removal width Wcut is smaller than the target value), when processing the subsequent substrate W, for example, the horizontal position of the nozzle 44 may be set to be located radially inward and the height position of the nozzle 44 may be set to be low. In the case in which the removal width Wcut is less than the target value, when processing the subsequent substrate W, for example, the angle of the nozzle 44 may be set to approach 90 degrees with respect to the front surface Wa of the substrate W and the discharge flow rate of the processing liquid L2 discharged from the nozzle 44 may be set to be large. In the case in which the removal width Wcut is less than the target value, when processing the subsequent substrate W, for example, the horizontal position of the mask 113 may be set to be located radially inward.

Figure 12A:
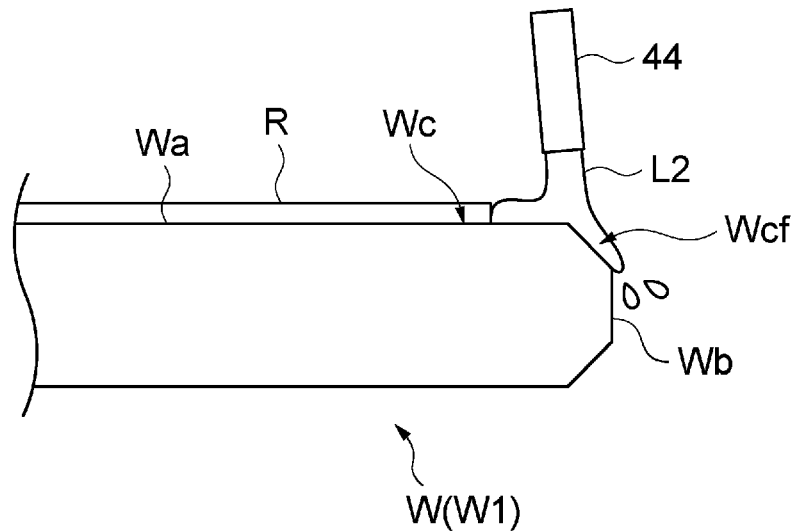
FIG. 12A is an enlarged view showing the vicinity of a peripheral edge portion of a substrate.

As illustrated in FIG. 12A, the vicinity of the peripheral edge of the substrate W may be chamfered due to the specification of the substrate W. Therefore, when the processing liquid L2 is supplied to a chamfered portion Wcf, the processing liquid L2 is likely to be discharged from the front surface Wa of the substrate W, and the processing of the peripheral edge portion of the film R using the processing liquid L2 may not be promoted. A size of the chamfered portion Wcf in the horizontal direction may vary depending on the substrate W.

Figure 12B:
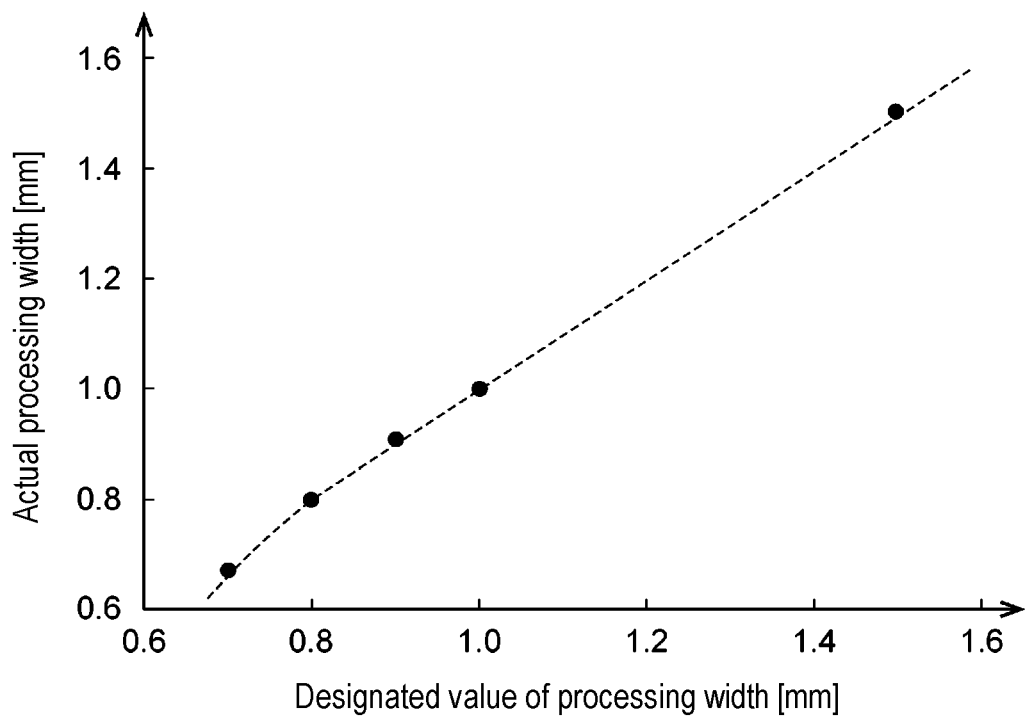
FIG. 12B is a graph showing an example of a correspondence relationship between a designated value of a processing width of a peripheral edge portion of a film and a processing width obtained by actually processing the peripheral edge portion of the film by a processing liquid.

FIG. 12B is a graph showing a correspondence relationship between a designated value Tg (target value) of the processing width of the peripheral edge portion of the film R processed by the processing liquid L2 and the actual processing width of the peripheral edge portion of the film R when the size of the chamfered portion Wcf in the horizontal direction is about 0.3 mm. As used herein, the term "processing width" means a width from the theoretical peripheral edge position of the substrate W. According to FIG. 12B, when the designated value Tg is changed to 0.7 mm, 0.8 mm, 0.9 mm, 1.0 mm, and 1.5 mm, respectively, and the peripheral edge portion of the film R is processed with the processing liquid L2, the actual processing widths were about 0.67 mm, about 0.8 mm, about 0.91 mm, about 1.0 mm, and about 1.50 mm. That is, when the designated value Tg is 0.8 mm or more, the actual processing width was substantially the same as the designated value Tg. However, when the designated value Tg is less than 0.8 mm, the actual processing width was smaller than the designated value Tg. In other words, when the designated value Tg is less than 0.8 mm, there was a large deviation between the designated value Tg and the actual processing width.

Therefore, when the designated value Tg is smaller than a predetermined threshold value Th1 (for example, 0.8 mm), the setting part M7 may correct a supply condition of the processing liquid L2 supplied from the nozzle 44 according to the deviation amount. The designated value Tg and the threshold Th1 (second threshold) may be stored in the storage part M2, or may be, for example, values input by the operator through the operation part 7 or the like. Deviation amounts may be calculated in advance by processing the peripheral edge portion of the film R with a plurality of designated values Tg (including values equal to or greater than the threshold Th1 and values less than the threshold Th1), and the obtained deviation amounts may be stored in the storage part M2.

For example, when the designated value Tg is smaller than the threshold value Th1, the setting part M7 may correct the horizontal position of the nozzle 44 according to the deviation amount so that the liquid landing position of the processing liquid L2 on the substrate W is on the center side of the substrate W, and may set the corrected horizontal position of the nozzle 44 as a new processing parameter. When the designated value Tg is smaller than the threshold value Th1, the setting part M7 may correct the height position of the nozzle 44 according to the deviation amount so that the nozzle 44 approaches the substrate W, and may set the corrected height position of the nozzle 44 as a new processing parameter. When the designated value Tg is smaller than the threshold value Th1, the setting part M7 may correct the angle of the nozzle 44 so that the supply angle of the processing liquid L2 with respect to the substrate W approaches 90 degrees, and may set the corrected angle of the nozzle 44 as a new processing parameter. The setting part M7 may correct the supply amount of the processing liquid L2 (may control the operation of the pump 42) so that the discharge flow rate of the processing liquid L2 discharged from the nozzle 44 increases, and may set the corrected supply amount of the processing liquid L2 as a new processing parameter.

Even if the designated value Tg is equal to or greater than the threshold Th1, the designated value Tg may not completely match the actual processing width. Therefore, the setting part M7 may calculate a deviation amount Δd1 between designated value Tg and actual processing width when the designated value Tg is equal to or greater than the threshold Th1, and a deviation amount Δd2 between the designated value Tg and the actual processing width when the designated value Tg is less than the threshold Th1. The setting part M7 may calculate a net deviation amount ΔD reflecting the existence of the chamfered portion Wcf from a difference between the deviation amount Δd1 and the deviation amount Δd2. The setting part M7 may correct the supply condition of the processing liquid L2 supplied from the nozzle 44 based on the net deviation amount ΔD.

The operation control part M8 is configured to generate a control signal for processing the substrate W based on the processing parameters output from the setting part M7 and various processing parameters (for example, recipes for substrate processing) stored in the storage part M2. The operation control part M8 is configured to transmit the control signal to the respective parts of the substrate processing system 1 including the liquid processing unit U1 and the exposure subunit 110 to control the operations thereof. When the setting part M7 determines that the removal width Wcut exceeds the target value (when the setting part M7 determines that the removal width Wcut is greater than the target value), the operation control part M8 may generate a control signal for discarding or reprocessing a determination target substrate W.

The eccentricity amount calculation part M9 may be configured to read the data on the peripheral edge position of the substrate W detected by the eccentricity detection subunit 120 from the storage part M2, and calculate the eccentricity state of the substrate W held on the holding table 101 based on the peripheral edge position. The eccentricity amount calculation part M9 may calculate, for example, an eccentricity amount B and an eccentricity angle β of the substrate W as the eccentricity state. A method of calculating the eccentricity amount B and the eccentricity angle β may be identical to the method of calculating the eccentricity amount A and the eccentricity angle α.

The first adjustment part M10 is configured to adjust a placement position of the substrate W with respect to the holder 23 or the holding table 101 according to the eccentricity state of the substrate W. For example, the first adjustment part M10 may calculate the placement position of the substrate W so as to cancel the eccentricity amount A output from the second calculation part M4. For example, the first adjustment part M10 may be configured to generate a control signal for delivering the substrate W from the transfer arm A11 or A12 to the holder 23 or the holding table 101 at the placement position, and output the control signal to the transfer arm A11 or A12.

When one substrate W from which the peripheral edge portion of the film R has been removed by the liquid processing unit U11 is inspected by the inspection unit U13, the second calculation part M4 may calculate the eccentricity amount A based on a captured image of the one substrate W acquired by the inspection unit U13. The first adjustment part M10 may generate a control signal for delivering the substrate W (one substrate W or another substrate W) to be processed next in the liquid processing unit U11 from the transfer arm A11 to the holder 23 of the liquid processing unit U11 while cancelling the eccentricity amount A. The first adjustment part M10 may output the control signal to the transfer arm A11.

When one substrate W from which the peripheral edge portion of the film R has been removed by the liquid processing unit U21 is inspected by the inspection unit U23, the second calculation part M4 may calculate the eccentricity amount A based on a captured image of the one substrate W acquired by the inspection unit U23. The first adjustment part M10 may generate a control signal for delivering the substrate W (one substrate W or another substrate W) to be processed next in the liquid processing unit U21 from the transfer arm A12 to the holder 23 of the liquid processing unit U21 while cancelling the eccentricity amount A. The first adjustment part M10 may output the control signal to the transfer arm A12.

When an image of the one substrate W from which the peripheral edge portion of the film R has been exposed by the peripheral edge exposure unit U24 and the peripheral edge portion of the film R has been removed by the liquid processing unit U21 is captured by the inspection unit U23, the second calculation part M4 may calculate the eccentricity amount A based on the captured image of the one substrate W. The first adjustment part M10 may generate a control signal for delivering the substrate W (one substrate W or another substrate W) to be processed next in the peripheral edge exposure unit U24 from the transfer arm A12 to the holding table 101 while cancelling the eccentricity amount A. The first adjustment part M10 may output the control signal to the transfer arm A12.

As another example, the first adjustment part M10 may calculate the placement position of the substrate W so as to cancel the eccentricity amount B output from the eccentricity calculation part M9. Specifically, when the peripheral edge position of the substrate W is detected by the eccentricity detection subunit 120, the eccentricity amount calculation part M9 may calculate the eccentricity amount B of the substrate W. The first adjustment part M10 may generate a control signal for delivering the substrate W (one substrate W or another substrate W) to be processed next in the peripheral edge exposure unit U24 from the transfer arm A12 to the holding table 101 while cancelling the eccentricity amount B. The first adjustment part M10 may output the control signal to the transfer arm A12.

Figure 13A:
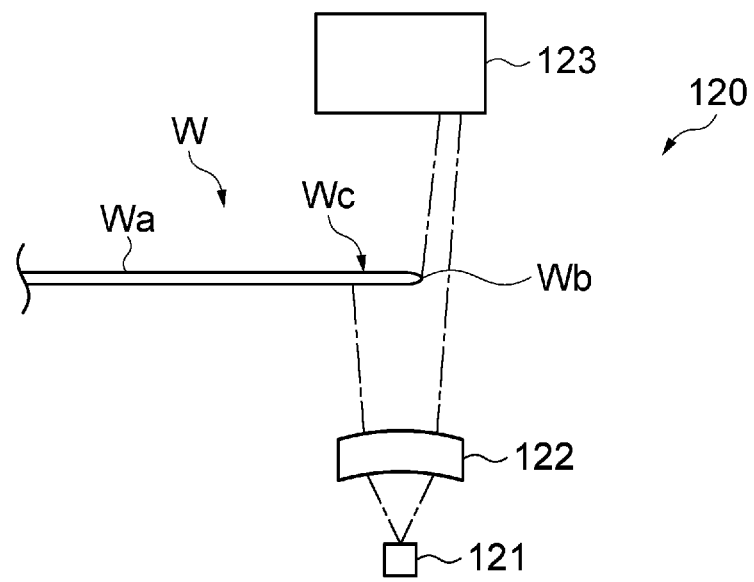
FIGS. 13A and 13B are diagrams for explaining an example of a state in which the deviation of a peripheral edge of the substrate with respect to an optical axis of the eccentricity detection subunit is large.
Figure 13B:
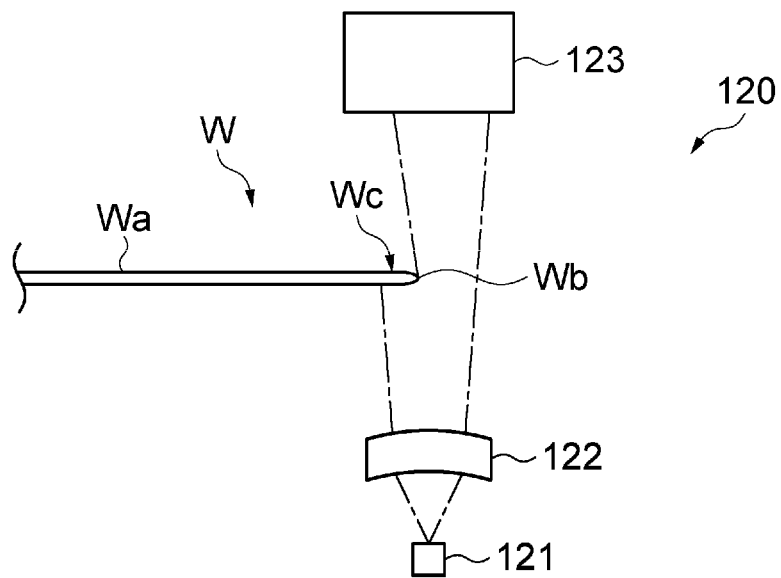

Further, when the eccentricity amount B of the substrate W is smaller than a predetermined threshold value Th2 (for example, 0.5 mm), the eccentricity detection subunit 120 may detect the peripheral edge position of the substrate W with extremely high precision. As used herein, the expression "when the eccentricity amount B of the substrate W is smaller than the threshold value Th2 (first threshold)" means that, as illustrated in FIG. 8, the peripheral edge of the substrate W is located near an optical axis (a virtual axis passing through the center of the optical path) of the eccentricity detection subunit 120. Meanwhile, the light-receiving position in the light receiver 123 may shift due to a diffraction phenomenon of light, and an error may occur in the peripheral edge position of the substrate W to be detected. As used herein, the expression "when the eccentricity amount B of the substrate W is equal to or greater than the threshold value Th2" means that the peripheral edge of the substrate W shifts greatly outward from the optical axis of the eccentricity detection subunit 120 (see FIG. 13A), or the peripheral edge of the substrate W shifts greatly inward from the optical axis of the eccentricity detection subunit 120 (see FIG. 13B).

Therefore, the first adjustment part M10 may be configured to determine whether or not the eccentricity amount B of the substrate W is equal to or greater than the threshold Th2. The first adjustment part M10 may be configured to adjust the placement position of the substrate W with respect to the holding table 101 according to the eccentricity amount B when the eccentricity amount B of the substrate W is equal to or greater than the threshold value Th2. Specifically, when the peripheral edge position of the substrate W is detected by the eccentricity detection subunit 120, the eccentricity amount B of the substrate W may be calculated by the eccentricity amount calculation part M9. When it is determined that the eccentricity amount B of the substrate W is equal to or greater than the threshold Th2, the first adjustment part M10 may generate a control signal for delivering the substrate W to be processed next in the peripheral edge exposure unit U24 from the transfer arm A12 to the holding table 101 while cancelling the eccentricity amount B. The first adjustment part M10 may output the control signal to the transfer arm A12.

The second adjustment part M11 may be configured to adjust an exposure position by the exposure subunit 110 with respect to the peripheral edge portion of the film R on the substrate W placed on the holding table 101 according to the eccentricity state of the substrate W. For example, the second adjustment part M11 may generate a control signal for moving the holding table 101 along the guide rail 104 so as to cancel the eccentricity amount B output from the eccentricity calculation part M9. The second adjustment part M11 may output the control signal to the drive mechanism 103. As a result, the holding table 101 is moved backward and forward along the guide rail 104 according to the eccentricity amount B. Therefore, the exposure position with respect to the peripheral edge portion of the film R is adjusted, and the exposure width with respect to the peripheral edge portion of the film R becomes constant.

[Hardware of Controller]

Figure 14:
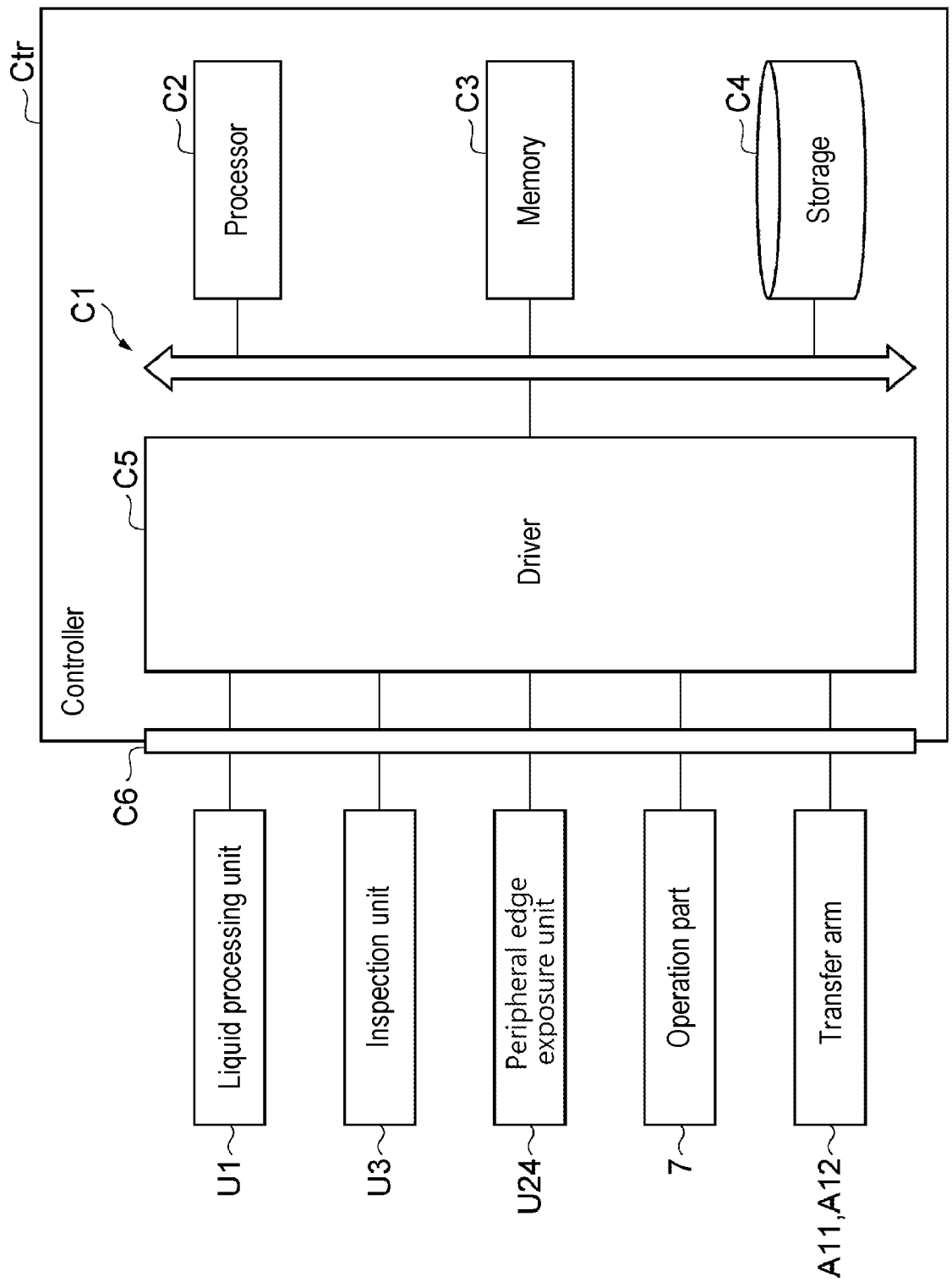
FIG. 14 is a schematic diagram showing an example of a hardware configuration of a controller.

The hardware of the controller Ctr may be constituted with, for example, one or more control computers. As shown in FIG. 14, the controller Ctr includes a circuit C1 as a hardware configuration. The circuit C1 may be constituted with an electrical circuitry. The circuit C1 may include a processor C2, a memory C3, a storage C4, a driver C5, and an input/output port C6.

The processor C2 executes a program in cooperation with at least one of the memory C3 and the storage C4 and executes the input/output of signals via the input/output port C6, thereby constituting the respective functional modules described above. The memory C3 and the storage C4 function as the storage part M2. The driver C5 is a circuit that drives various devices of the coating-developing apparatus 2. The input/output port C6 executes the input/output of signals among the driver C5 and various devices of the coating-developing apparatus 2 (for example, the liquid processing unit U1, the inspection unit U3, the peripheral edge exposure unit U24, the operation part 7, the transfer arms A11 and A12, and the like).

The substrate processing system 1 may include one controller Ctr, or may include a controller group (control part) constituted with a plurality of controllers Ctr. When the substrate processing system 1 includes a controller group, each of the above-described functional modules may be implemented by one controller Ctr, or may be implemented by a combination of two or more controllers Ctr. When the controller Ctr is constituted with a plurality of computers (circuit C1), each of the above-described functional modules may be implemented by one computer (circuit C1), or may be implemented by a combination of a plurality of computers (circuits C1). The controller Ctr may include a plurality of processors C2. In this case, each of the above-described functional modules may be implemented by one processor C2, or may be implemented by a combination of two or more processors C2.

Some of the functions of the controller Ctr of the substrate processing system 1 may be provided in a separate device other than the substrate processing system 1 and may be connected to the substrate processing system 1 via a network to implement various operations in the present embodiment. For example, if the functions of the processor C2, the memory C3, and the storage C4 of a plurality of substrate processing systems 1 are collectively implemented by one or a plurality of separate devices, pieces of information and operations of the plurality of substrate processing systems 1 may be managed and controlled collectively and remotely.

[Substrate Processing Method]

Next, a substrate processing method including the method of processing the peripheral edge portion of the film R formed on the front surface Wa of the substrate W (peripheral edge processing method) will be described with reference to FIGS. 15 to 17. In the following, as an example of the substrate processing method, a preparation process using the reference substrate W0, a process of processing the peripheral edge of the underlayer film R1 formed on the workpiece substrate W1, and a process of processing the peripheral edge of the resist film R2 formed on the workpiece substrate W1 will be described.

[Preparation Process Using Reference Substrate]

An example of the preparation process using the reference substrate W0 will be described with reference to FIGS. 10A and 15. The preparation process may be performed before the process of processing the peripheral edge of the film R, may be performed in parallel with the process of processing the peripheral edge of the film R, or may be performed after the process of processing the peripheral edge of the film R.

Figure 15:
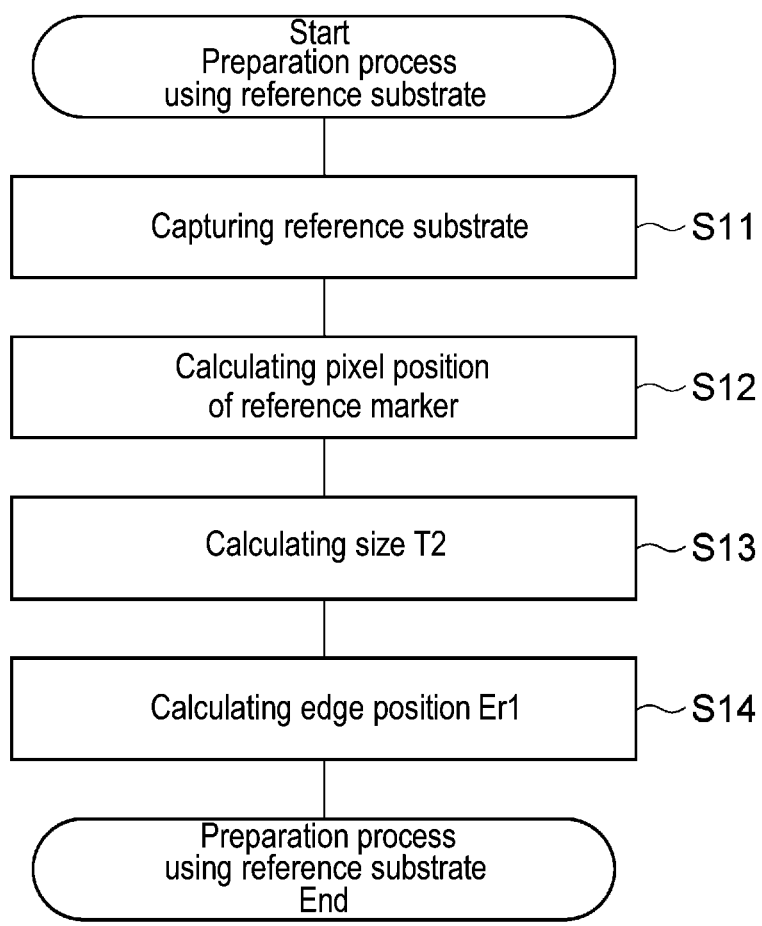
FIG. 15 is a flowchart for explaining an example of a preparation process using a reference substrate.

First, the reference substrate W0 is transferred to the inspection unit U3, and a captured image of the peripheral edge portion We of the reference substrate W0 as shown in FIG. 10B is acquired (see step S11 in FIG. 15). The captured image is stored in the storage part M2.

Subsequently, the first calculation part M3 performs image processing on the captured image stored in the storage part M2 to calculate a position T1 [pixel] of the reference marker RP in the captured image (see step S12 in FIG. 15). Subsequently, the first calculation part M3 calculates a difference between the design dimension d1 of the radius of the substrate W, which is a known value, and the actual position (distance d2) of the reference marker RP, which is a known value, as a size T2 of the reference substrate W0 in the captured image (see step S13 in FIG. 15). For example, when the size per pixel in the captured image is μ [mm/pixel], the size T2 [pixel] is calculated by the following equation (1). The size per pixel is a known value that is determined by set values, arrangement, or the like of the optical system components in the inspection unit U3.

$$T2=(d-d2)/\mu \tag{1}$$

Subsequently, the first calculation part M3 calculates a peripheral edge position Er1 [pixel] in the captured image of the reference substrate W0 based on the position T1 and the size T2 (see step S14 in FIG. 15). For example, the peripheral edge position Er1 is calculated by the following equation (2). With this, the preparation process ends. The peripheral edge position Er1 is output from the first calculation part M3 to the second calculation part M4. The peripheral edge position Er1 is the same value at all measurement positions (angle θ) in the circumferential direction.

$$Er1=T1+T2=T1+(d-d2)/\mu \tag{2}$$

[Process of Processing Peripheral Edge of Underlayer Film Formed on Workpiece Substrate]

Figure 11:
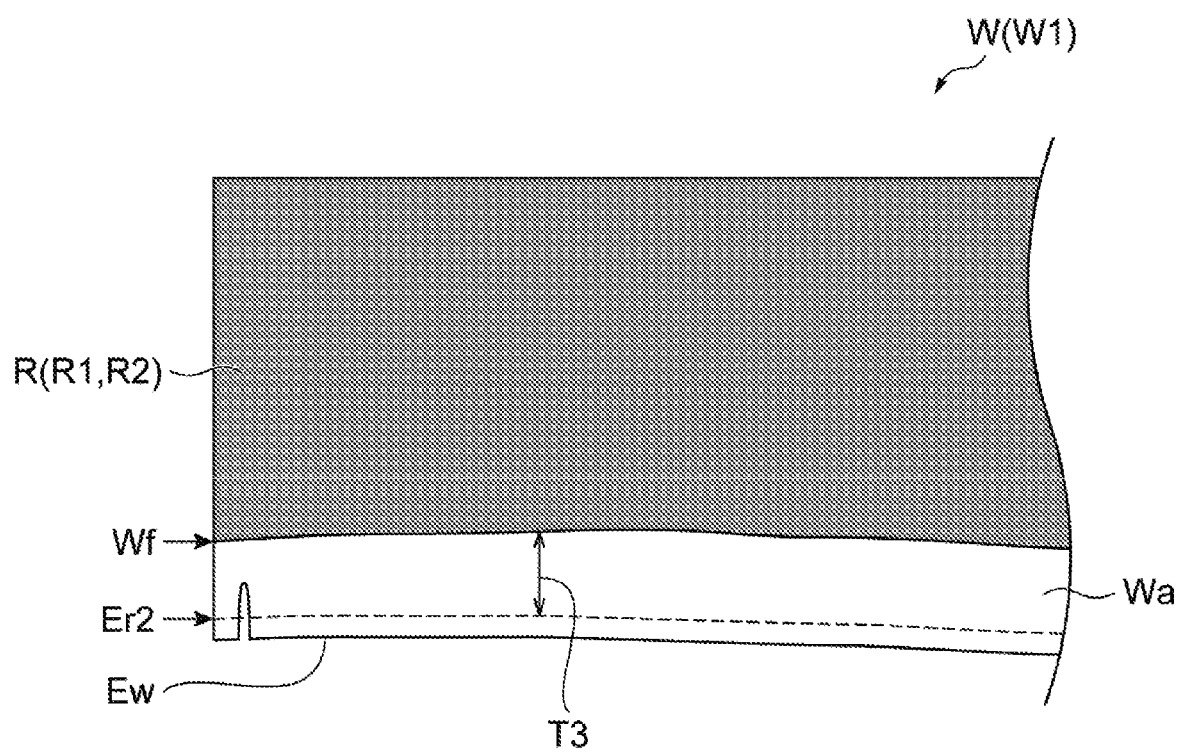
FIG. 11 is a schematic diagram showing an example of a captured image of a peripheral edge portion of a workpiece substrate on which a film is formed.

An example of the process of processing the peripheral edge of the underlayer film R1 formed on the workpiece substrate W1 will be described with reference to FIGS. 11 and 16.

Figure 16:
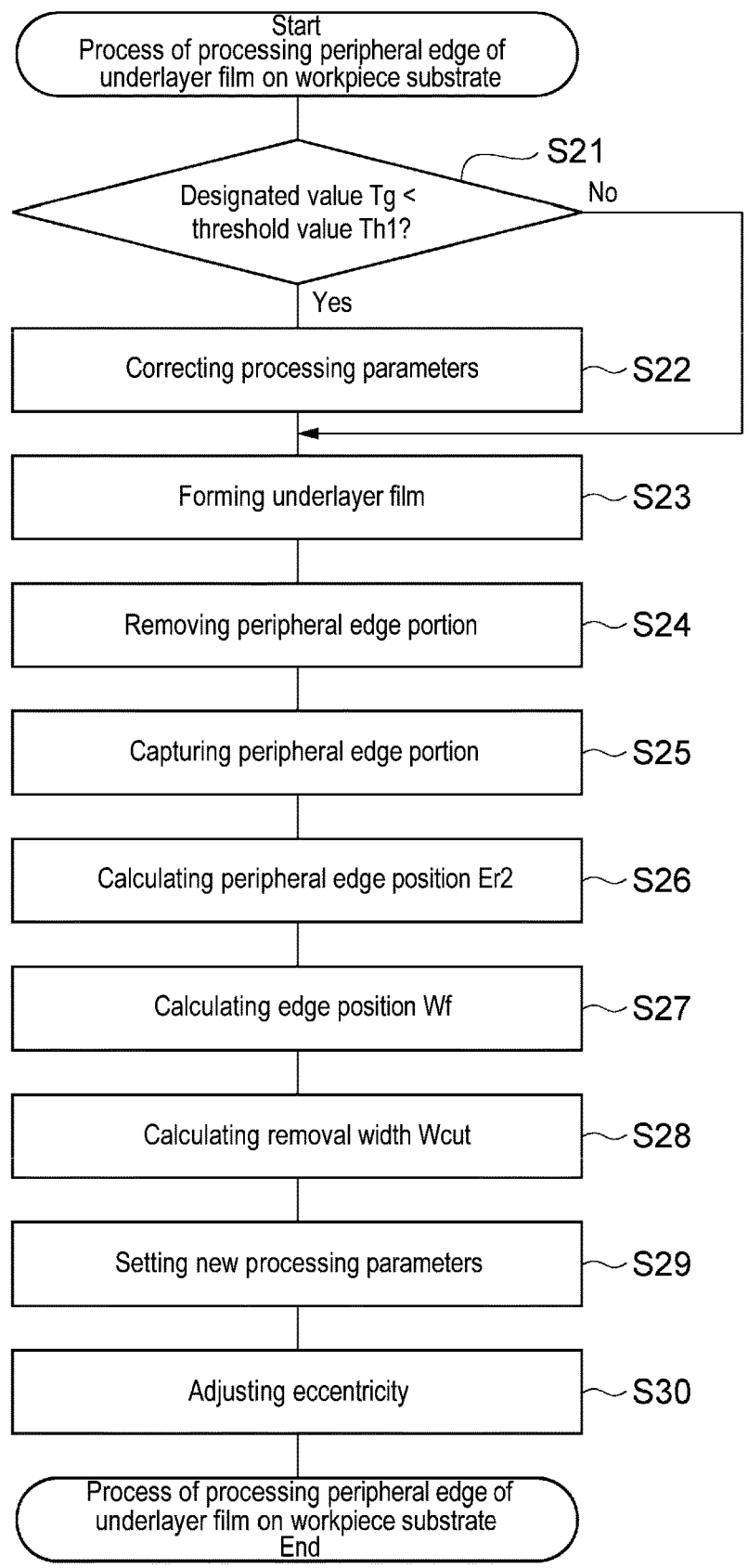
FIG. 16 is a flowchart for explaining an example of a process of processing a peripheral edge of an underlayer film on a workpiece substrate.

First, the setting part M7 reads out from the storage part M2 the designated value Tg of the processing width of the underlayer film R1, which is input by the operator through the operation part 7, and the threshold value Th1, and determines whether or not the designated value Tg is smaller than the threshold value Th1 (see step S21 in FIG. 16). When the designated value Tg is determined to be smaller than the threshold Th1 (YES in step S21 in FIG. 16), the setting part M7 corrects the supply condition of the processing liquid L2 supplied from the nozzle 44 according to the deviation amount, and sets the supply condition of the processing liquid L2 as a new processing parameter (see step S22 in FIG. 16). Thereafter, the process proceeds to subsequent step S23. On the other hand, when the designated value Tg is determined to be not smaller than the threshold Th1 (NO in step S21 in FIG. 16), the setting part M7 does not correct the supply condition of the processing liquid L2 and the process proceeds to subsequent step S23.

Subsequently, the underlayer film R1 is formed on the front surface Wa of the workpiece substrate W1 (see step S23 in FIG. 16). First, the first adjustment part M10 controls the transfer arm A11 to transfer the workpiece substrate W1 to the liquid processing unit U11 and place the workpiece substrate W1 on the holder 23. Subsequently, the operation control part M8 controls the liquid processing unit U11 based on the processing parameters, arranges the nozzle 34 above the workpiece substrate W1, and allows the processing liquid L1 to be discharged from the nozzle 34 to the front surface Wa of the workpiece substrate W1. As a result, the underlayer film R1, which is kept in an unsolidified state, is formed on the front surface Wa of the workpiece substrate W1.

Subsequently, the peripheral edge portion of the underlayer film R1 kept in an unsolidified state is removed (see step S24 in FIG. 16). First, the operation control part M8 controls the liquid processing unit U11 to rotate the workpiece substrate W1 at a predetermined rotation speed. In this state, the operation control part M8 controls the liquid processing unit U11 to supply the processing liquid L2 from the nozzle 44 to the peripheral edge portion of the underlayer film R1 by using the corrected processing parameters or the processing parameters stored in the storage part M2 without correction (the supply conditions of the processing liquid L2). That is, in a state in which the horizontal position of the nozzle 44, the height position of the nozzle 44, the angle of the nozzle 44, the discharge flow rate of the processing liquid L2 discharged from the nozzle 44, and the like are set according to the processing parameters, the processing liquid L2 (organic solvent) is supplied from the nozzle 44 to the peripheral edge portion of the underlayer film R1. As a result, the peripheral edge portion of the underlayer film R1 is removed by the processing liquid L2. Thereafter, the workpiece substrate W1 is transferred to the heat treatment unit U12 by the transfer arm A11. The underlayer film R1 is solidified by heating the workpiece substrate W1 in the heat treatment unit U12.

Subsequently, an image of the peripheral edge portion of the solidified underlayer film R1 is captured (see step S25 in FIG. 16). First, the controller Ctr controls the transfer arm A11 to transfer the workpiece substrate W1 to the inspection unit U13. Subsequently, the controller Ctr controls the inspection unit U13 to acquire a captured image of the peripheral edge portion We of the workpiece substrate W1 as shown in FIG. 11. The captured image is stored in the storage part M2.

Subsequently, the second calculation part M4 calculates the theoretical peripheral edge position Er2 of the workpiece substrate W1 based on the peripheral edge position Er1 and the captured image of the workpiece substrate W1 (see step S26 in FIG. 16). First, the second calculation part M4 calculates an actual peripheral edge position Ew of the workpiece substrate W1 based on the captured image of the peripheral edge portion We of the workpiece substrate W1. For example, the second calculation part M4 may specify a peripheral edge position Ew (θ) as a function of the angle θ by calculating a contrast ratio between pixels adjacent to each other in the vertical direction for each of vertical pixel groups at a plurality of measurement positions (for example, 360 points divided at intervals of 1 degrees) in the circumferential direction of the workpiece substrate W1. For example, the second calculation part M4 may detect coordinates at which the contrast ratio is equal to or greater than a predetermined value, from the vertical pixel groups, and may specify the detected coordinates as the peripheral edge position Ew.

Subsequently, the second calculation part M4 calculates an eccentricity state of the workpiece substrate W1 based on the peripheral edge position Ew. The second calculation part M4 calculates the eccentricity amount A and the eccentricity angle α of the workpiece substrate W1 as the eccentricity state. A known method may be used as the method of calculating the eccentricity amount A and the eccentricity angle α. An example of the known method will be described below. For example, at four points of 0 degrees, 90 degrees, 180 degrees, and 270 degrees, differences L0, L90, L180, and L270 between the peripheral edge position Er1 and the peripheral edge position Ew (θ) are calculated by the following equations (3) to (6), respectively.

$$L0 = Er1 - Ew \text{ (0 degrees)} \tag{3}$$

$$L90 = Er1 - Ew \text{ (90 degrees)} \tag{4}$$

$$L180 = Er1 - Ew \text{ (180 degrees)} \tag{5}$$

$$L270 = Er1 - Ew \text{ (270 degrees)} \tag{6}$$

When the eccentricity parameters t and u are defined by the following equations (7) and (8) using L0, L90, L180, and L270, the eccentricity amount A and the eccentricity angle α may be calculated by the following equations (9) and (10).

$$t = (L90 - L270)/2 \tag{7}$$

$$u = (L180 - L0)/2 \tag{8}$$

$$A = \sqrt{t^2 + u^2} \tag{9}$$

$$\alpha = \tan^{-1}(t/u) \tag{10}$$

The second calculation part M4 may calculate the eccentricity amount A and the eccentricity angle α in further consideration of a difference between four measurement positions spaced apart from each other by 90 degrees, including a position shifted by a predetermined angle from 0 degrees.

Subsequently, the second calculation part M4 calculates the peripheral edge position Er2 in consideration of the eccentricity state of the workpiece substrate W1. For example, using the eccentricity amount A and the eccentricity angle α, the peripheral edge position Er2 (θ) may be calculated as a function of the angle θ by the following equation (11).

$$Er2(\theta) = A\sin(\theta+\alpha) + Er1 \quad (11)$$

Subsequently, the third calculation part M5 calculates the edge position Wf of the underlayer film R1 formed on the front surface Wa of the workpiece substrate W1 based on the captured image of the workpiece substrate W1 (see step S27 in FIG. 16). For example, the third calculation part M5 may specify the edge position Wf (θ) as a function of the angle θ by calculating the contrast ratio between pixels adjacent to each other in the vertical direction for each of vertical pixel groups at a plurality of measurement positions (for example, 360 points divided at intervals of 1 degrees) in the circumferential direction of the workpiece substrate W1. For example, the third calculation part M5 may detect coordinates at which the contrast ratio is equal to or greater than a predetermined value, in the vertical pixel groups, and may specify the detected coordinates as the edge position Wf.

Subsequently, the width calculation part M6 calculates a width T3 (θ) as a function of the angle θ based on a difference between the peripheral edge position Er2 (θ) and the edge position Wf (θ). That is, the width T3 (θ) may be calculated by the following equation (12).

$$T3(\theta) = Er2(\theta) - Wf(\theta) \quad (12)$$

The width calculation part M6 calculates a removal width Wcut (θ) [mm] of the peripheral edge portion of the underlayer film R1 by multiplying the width T3 (θ) by the size per pixel μ [mm/pixel] (see step S28 in FIG. 16). That is, the removal width Wcut (θ) may be calculated by the following equation (13). The removal width Wcut (θ) corresponds to the size from the theoretical peripheral edge position of the workpiece substrate W1(θ) to the edge position of the underlayer film R1 (θ).

$$\text{Removal width } Wcut(\theta) = T3(\theta)/\mu \quad (13)$$

Subsequently, the setting part M7 sets new processing parameters for processing the peripheral edge portion of the underlayer film R1 based on the peripheral edge position Er2 (see step S29 in FIG. 16). For example, the setting part M7 sets processing parameters for the workpiece substrate W1 to be processed next, so that a difference between the removal width Wcut (θ) output from the width calculation part M6 and the target value of the removal width of the peripheral edge portion of the underlayer film R1 of the workpiece substrate W1 becomes small. Based on the new processing parameters, the same workpiece substrate W1 may be processed again, or another workpiece substrate W1 may be processed.

Subsequently, the first adjustment part M10 adjusts the placement position of the substrate W with respect to the holder 23 according to the eccentricity state of the workpiece substrate W1 (see step S30 in FIG. 16). For example, the first adjustment part M10 may calculate the placement position of the workpiece substrate W1 so as to cancel the eccentricity amount A output from the second calculation part M4, and may control the transfer arm A11 so as to place the workpiece substrate W1 to be processed next on the holder 23 at the placement position. Based on the placement position, the same workpiece substrate W1 may be replaced on the holder 23, or another workpiece substrate W1 may be placed on the holder 23. The process of step S29 may be performed at any time after the eccentricity amount A is calculated in step S26.

As described above, the underlayer film R1 is formed on the workpiece substrate W1. Further, the new processing parameters for the workpiece substrate W1 to be processed next and the new placement position of the workpiece substrate W1 to be processed next with respect to the holder 23 are calculated. As a result, the peripheral edge portion of the underlayer film R1 is processed more accurately on the workpiece substrate W1 to be processed next.

[Process of Processing Peripheral Edge of Resist Film on Workpiece Substrate]

An example of the process of processing the peripheral edge of the resist film R2 on the workpiece substrate W1 will be described with reference to FIGS. 11 and 17.

Figure 17:
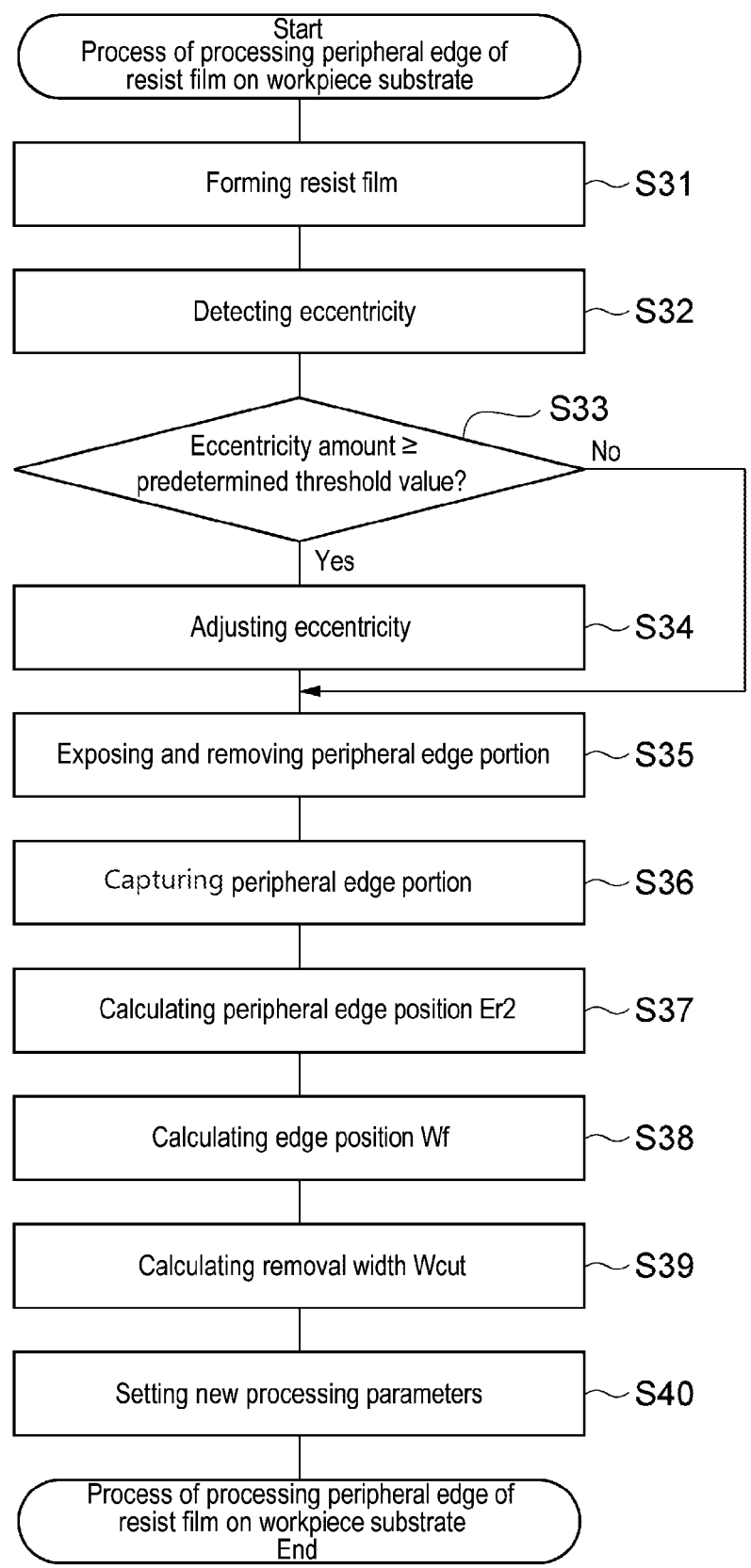
FIG. 17 is a flowchart for explaining an example of a process of processing a peripheral edge of a resist film on the workpiece substrate.

First, the resist film R2 is formed on the front surface Wa of the workpiece substrate W1 (see step S31 in FIG. 17). For example, the first adjustment part M10 controls the transfer arm A12 to transfer the workpiece substrate W1 to the liquid processing unit U21 and place the workpiece substrate W1 on the holder 23. Subsequently, based on the processing parameters, the operation control part M8 controls the liquid processing unit U21 to arrange the nozzle 34 above the workpiece substrate W1 and allow the processing liquid L1 to be discharged from the nozzle 34 to the front surface Wa of the workpiece substrate W1. As a result, the resist film R2, which kept in an unsolidified state, is formed on the front surface Wa of the workpiece substrate W1. The resist film R2 may be formed on the front surface Wa of the workpiece substrate W1 on which the underlayer film R1 is formed. That is, the processing after step S31 in FIG. 17 may be performed after the underlayer film R1 is formed on the front surface Wa of the workpiece substrate W1 through steps S21 to S29 in FIG. 16.

Subsequently, the controller Ctr controls the transfer arm A12 to transfer the workpiece substrate W1 to the peripheral edge exposure unit U24 and place the workpiece substrate W1 on the holding table 101. Subsequently, the controller Ctr controls the peripheral edge exposure unit U24 so that the eccentricity detection subunit 120 detects the peripheral edge position of the workpiece substrate W1 while rotating the workpiece substrate W1 once. The eccentricity amount calculation part M9 calculates the eccentricity state (the eccentricity amount B and the eccentricity angle β) of the substrate W held on the holding table 101 based on the peripheral edge position (see step S32 in FIG. 17). The eccentricity amount B and the eccentricity angle β0 may be calculated in the same manner as that of calculating the eccentricity amount A and the eccentricity angle α.

Subsequently, the first adjustment part M10 determines whether or the eccentricity amount B is equal to or greater than the threshold value Th2 (see step S33 in FIG. 17). When the eccentricity amount B is determined to be equal to or greater than the threshold value Th2 (YES in step S33 in FIG. 17), the first adjustment part M10 calculates the placement position of the workpiece substrate W1 so as to cancel the eccentricity amount B, and controls the transfer arm A12 so as to place the workpiece substrate W1 to be processed next on the holding table 101 at the placement position (see step S34 in FIG. 17). Based on the placement position, the same workpiece substrate W1 may be replaced on the holding table 101 again, or another workpiece substrate W1 may be placed on the holding table 101. Thereafter, the process proceeds to subsequent step S35. On the other hand, when the eccentricity amount B is determined to be smaller than the threshold value Th2 (NO in step S33 in FIG. 17), the first adjustment part M10 does not adjust the placement position of the workpiece substrate W1 based on the eccentricity amount B and the process proceeds to subsequent step S35.

Subsequently, the peripheral edge portion of the unsolidified resist film R2 is exposed and removed (see step S35 in FIG. 17). First, the operation control part M8 controls the peripheral edge exposure unit U24 to expose the peripheral edge portion of the resist film R2 according to the processing parameters stored in the storage part M2 while rotating the workpiece substrate W1. At this time, the second adjustment part M11 adjusts the exposure position with respect to the peripheral edge portion of the resist film R2 so as to cancel the eccentricity amount B by moving the holding table 101 backward and forward along the guide rail 104 according to the eccentricity amount B. Subsequently, the workpiece substrate W1 is transferred to the liquid processing unit U21 by the transfer arm A12, and the processing liquid (developing agent) L2 is supplied from the nozzle 44 to the resist film R2. As a result, the exposed peripheral edge portion of the resist film R2 is removed. Thereafter, the workpiece substrate W1 is transferred to the heat treatment unit U22 by the transfer arm A12. The resist film R2 is solidified by heating the workpiece substrate W1 in the heat treatment unit U22.

Subsequently, an image of the peripheral edge portion of the solidified resist film R2 is captured (see step S36 in FIG. 17). The process of step S36 may be performed in the same manner as the process of step S25.

Subsequently, the second calculation part M4 calculates the theoretical peripheral edge position Er2 of the workpiece substrate W1 based on the peripheral edge position Er1 and the captured image of the workpiece substrate W1 (see step S37 in FIG. 17). The process of step S37 may be performed in the same manner as the process of step S26.

Subsequently, the third calculation part M5 calculates the edge position Wf of the resist film R2 formed on the front surface Wa of the workpiece substrate W1 based on the captured image of the workpiece substrate W1 (see step S38 in FIG. 17). The process of step S38 may be performed in the same manner as the process of step S27.

Subsequently, the width calculation part M6 calculates the removal width Wcut (θ) [mm] of the peripheral edge portion of the resist film R2 (see step S39 in FIG. 17). The process of step S39 may be performed in the same manner as the process of step S28.

Subsequently, the setting part M7 sets new processing parameters for processing the peripheral edge portion of the resist film R2 based on the peripheral edge position Er2 (see step S40 in FIG. 17). The process of step S40 may be performed in the same manner as the process of step S39. Based on the new processing parameters, the same workpiece substrate W1 may be processed again, or another workpiece substrate W1 may be processed.

As described above, the resist film R2 is formed on the workpiece substrate W1. Further, the new processing parameters for the workpiece substrate W1 to be processed next and the new placement position of the workpiece substrate W1 to be processed next on the holding table 101 are calculated. As a result, the peripheral edge portion of the resist film R2 is processed with higher precision on the workpiece substrate W1 to be processed next.

[Actions]

Since the size of the substrate W may have a manufacturing error, the size (diameter) of the substrate W may vary among the substrates W. For example, there may be a case where the actual peripheral edge position Ew of the substrate W is smaller than the theoretical peripheral edge position Er2 of the substrate W (see FIGS. 18A and 18D), a case where the actual peripheral edge position Ew substantially coincides with the theoretical peripheral edge position Er2 (see FIGS. 18B and 18E), and a case where the actual peripheral edge position Ew is larger than the theoretical peripheral edge position Er2 (see FIGS. 18C and 18F).

Figure 18A:
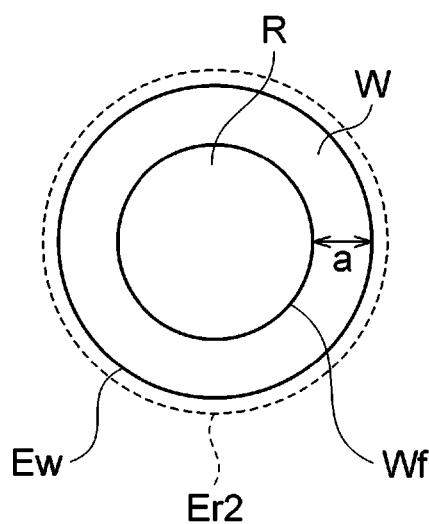
FIGS. 18A to 18C are diagrams for explaining an example of a process of processing a peripheral edge of a film with a peripheral edge of the substrate used as a reference when a size of the substrate varies.
Figure 18B:
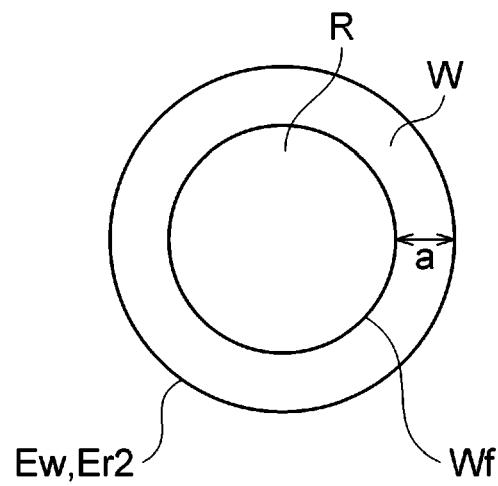
Figure 18C:
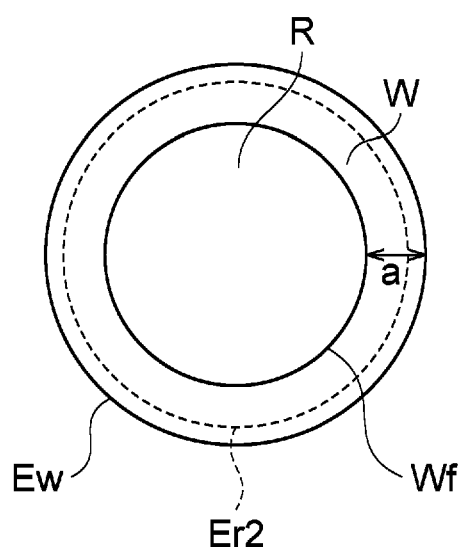

In this case, when the peripheral edge portion of the film R is processed with reference to the peripheral edge position of the substrate W so that the distance from the peripheral edge of the substrate W becomes constant, the area of the film R may vary from substrate W to substrate W. For example, as shown in FIGS. 18A to 18C, when the peripheral edge portion of the film R is removed by a width a with reference to the peripheral edge of the substrate W, the area of the film R shown in FIG. 18A becomes smaller than the area of the film R shown in FIG. 18B, and the area of the film R shown in FIG. 18C becomes larger than the area of the film R shown in FIG. 18B. As a result, the number of semiconductor products that may be manufactured from one sheet of substrate W may vary from substrate W to substrate W.

Figure 18D:
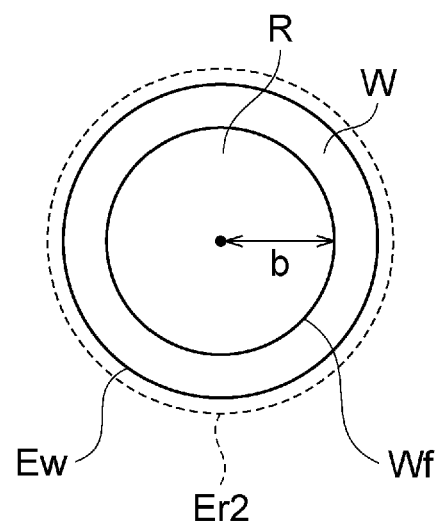
FIGS. 18D to 18F are diagrams for explaining an example of a process of processing a peripheral edge of a film with a center of the substrate used as a reference when the size of the substrate varies.
Figure 18E:
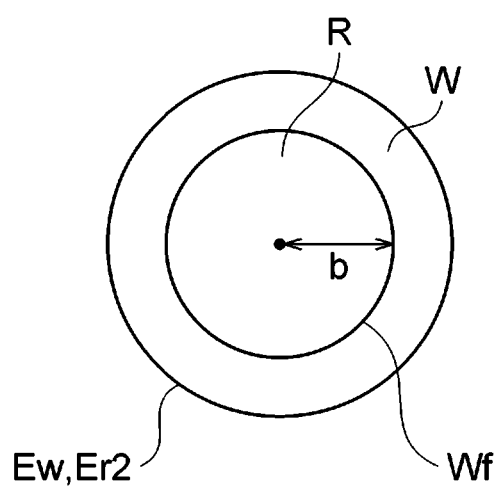
Figure 18F:
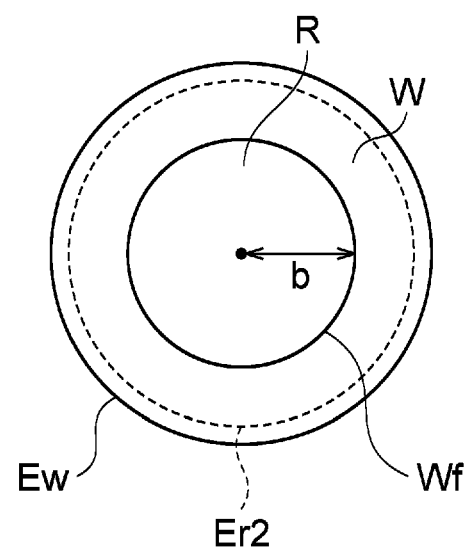

In contrast, according to the above-described example, the processing parameters are set based on the theoretical peripheral edge position Er2 of the substrate W with reference to the center of the substrate W. Therefore, for example, as shown in FIGS. 18D to 18F, the film R having the radius b is formed on any substrate W even if the size of the substrate W varies. Thus, while not being affected by the variation in the radial size of the substrate W, the peripheral edge portion of the film R may be processed with reference to the center of the substrate W. Accordingly, it is possible to process the peripheral edge portion of the film R with high precision.

According to the above-described example, the third calculation part M5 calculates the edge position Wf on the captured image of the workpiece substrate W1 by using the difference in brightness (contrast ratio) of the captured image of the workpiece substrate W1. Further, the setting part M7 sets the processing parameters based on the removal width Wcut obtained from the width T3, which is the difference between the peripheral edge position Er2 and the edge position Wf. Therefore, by using the processing parameters set based on the state of the film R formed on the workpiece substrate W1, it is possible to adjust the edge position Wf of the film R formed on the substrate W next.

According to the above-described example, the setting part M7 may set the processing parameters by comparing the removal width Wcut with the predetermined target value stored in the storage part M2. In this case, it is possible to bring the edge position Wf of the film R to be formed next on the substrate W closer to the predetermined target value.

According to the above-described example, the first calculation part M3 calculates the theoretical peripheral edge position Er1 of the reference substrate W0 by using the reference marker RP provided on the reference substrate W0. In this case, even if the captured image of the reference substrate W0 does not include the center of the reference substrate W0, it is possible to calculate the theoretical peripheral edge position Er1 of the reference substrate W0 with reference to the center of the reference substrate W0.

According to the above-described example, the second calculation part M4 calculates the theoretical peripheral edge position Er2 of the workpiece substrate W1 in consideration of the eccentricity state of the workpiece substrate W1. Therefore, the peripheral edge position Er2 in which the eccentricity state of the workpiece substrate W1 is reduced or eliminated is obtained. Accordingly, it is possible to process the peripheral edge portion of the film R with higher precision by using the processing parameters newly set based on the peripheral edge position Er2.

According to the above-described example, the first adjustment part M10 adjusts the placement position of the substrate W with respect to the holder 23 or the holding table 101 according to the eccentricity state of the substrate W. Therefore, the eccentricity state of the substrate W may be reduced or eliminated by adjusting the placement position of the substrate W on the holder 23 or the holding table 101. Therefore, it becomes possible to process the peripheral edge portion of the film R with high precision.

According to the above-described example, when the eccentricity amount B of the substrate W is equal to or greater than the threshold value Th2, the first adjustment part M10 may adjust the placement position of the substrate W with respect to the holding table 101 according to the eccentricity amount B. In this case, the placement position is adjusted when the error in the placement position of the substrate W is large, but the placement position is not adjusted when the error is not so large. Accordingly, the frequency of adjustment of the placement position is reduced, which makes it possible to improve the processing efficiency when processing a plurality of substrates W.

According to the above-described example, the second adjustment part M11 may adjust the exposure position by the exposure subunit 110 with respect to the peripheral edge portion of the film R on the substrate W placed on the holding table 101, according to the eccentricity state of the substrate W. In this case, the peripheral edge portion of the film R is exposed while cancelling the eccentricity state of the substrate W. Therefore, the peripheral edge portion of the film R is exposed with a uniform width, which makes it possible to process the peripheral edge portion of the film R with higher precision.

According to the above-described example, when the designated value Tg is smaller than the threshold value Th1, the setting part M7 may correct the supply condition of the processing liquid L2 supplied from the nozzle 44. In this case, the peripheral edge portion of the film R is processed according to the designated value Tg while eliminating the influence of the chamfered portion Wcf of the substrate W. Therefore, it is possible to process the peripheral edge portion of the film R with higher precision.

According to the above-described example, the setting part M7 may correct the horizontal position of the nozzle 44, the height position of the nozzle 44, the angle of the nozzle 44, or the supply amount of the processing liquid supplied from the nozzle 44, as the supply conditions of the processing liquid L2 supplied from the nozzle 44. In this case, by controlling various parameters relating to the nozzles 44, it is possible to relatively easily correct the supply conditions of the processing liquid L2 supplied from the nozzle 44.

Modifications

It should be considered that the present disclosure is exemplary and not limitative in all respects. Various omissions, substitutions, modifications, and the like may be made to the above-described example without departing from the scope and spirit of the claims.

(1) According to the above-described example, the peripheral edge portion of the resist film R2 is removed by the edge exposure and development using the peripheral edge exposure unit U24. Just like the removal of the peripheral edge portion of the underlayer film R1, the peripheral edge portion of the resist film R2 may be removed by supplying the processing liquid L2 (organic solvent) to the peripheral edge portion of the resist film R2 through steps S21 to S30 in FIG. 16.

Figure 19:
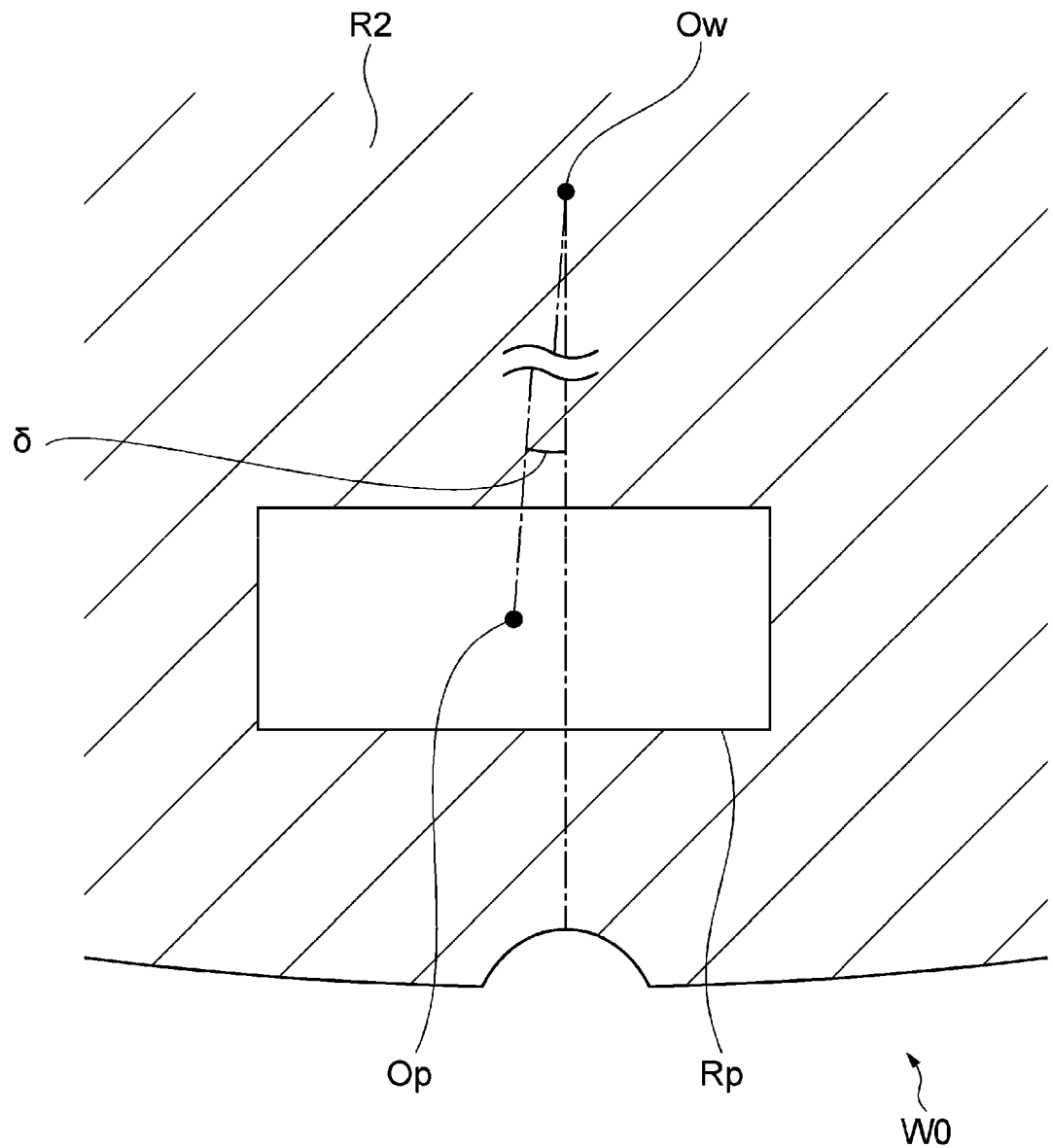
FIG. 19 is a schematic diagram for explaining a process of correcting an eccentricity angle of a mask.

(2) The eccentricity angle δ of the mask 113 may be corrected by using the reference substrate W0. First, the resist film R2 is formed on the front surface Wa of the reference substrate W0. Then, the resist film R2 is exposed through the mask 113 and developed in a state in which the entire mask 113 overlaps the front surface Wa of the reference substrate W0. Thus, an opening pattern Rp as shown in FIG. 19 is formed on the front surface Wa of the reference substrate W0.

Subsequently, the front surface Wa of the reference substrate W0 is captured by the inspection unit U3 to obtain a captured image thereof. Subsequently, for example, an eccentricity angle δ defined by a virtual line that connects the center Ow of the reference substrate W0 and the cutout portion of the reference substrate W0, and a virtual line that connects the center Ow of the reference substrate W0 and the center Op of the opening pattern Rp, is calculated by the controller Ctr based on the captured image of the front surface Wa of the reference substrate W0.

Subsequently, the controller Ctr may calculate a placement position of the substrate W so as to cancel the calculated eccentricity angle δ, and may control the transfer arm A12 so as to place the workpiece substrate W1 to be processed later on the holding table 101 at the placement position. For example, after rotating the workpiece substrate W1 by the calculated eccentricity angle δ, the controller Ctr may control the transfer arm A12 so as to place the workpiece substrate W1 on the holding table 101. As a result, the workpiece substrate W1 is placed on the holding table 101 so that the cutout portion of the workpiece substrate W1 is positioned on the virtual line that connects the center Ow of the reference substrate W0 and the center Op of the opening pattern Rp.

OTHER EXAMPLES

Example 1

An example of a peripheral edge processing apparatus includes: a capturing part configured to capture a peripheral edge portion of a substrate, which includes a reference substrate and a workpiece substrate, so as to acquire a captured image of the reference substrate and a captured image of the workpiece substrate; a first calculation part configured to calculate a theoretical peripheral edge position of the reference substrate in the captured image of the reference substrate with reference to a center of the reference substrate; a second calculation part configured to calculate a theoretical peripheral edge position of the workpiece substrate in the captured image of the workpiece substrate based on the theoretical peripheral edge position of the reference substrate and the captured image of the workpiece substrate; a setting part configured to set processing parameters for the peripheral edge portion of the substrate based on the theoretical peripheral edge position of the workpiece substrate; and a processing part configured to process the peripheral edge portion of the substrate based on the processing parameters. In this case, the processing parameters are set based on the theoretical peripheral edge position of the reference substrate with reference to the center of the reference substrate. Therefore, while not being affected by a radial size variation of the substrate, a peripheral edge portion of a film may be processed with reference to the center of the substrate. Accordingly, it is possible to process the peripheral edge portion of the film with high precision.

Example 2

The apparatus of Example 1 may further include a third calculation part configured to calculate an edge position of a film formed on a front surface of the workpiece substrate based on the captured image of the workpiece substrate, and the setting part may be configured to set the processing parameters based on a difference value between the theoretical peripheral edge position of the workpiece substrate and the edge position of the film. In this case, by using the processing parameters set based on a state of the film formed on the workpiece substrate, it is possible to adjust the edge position of the film to be formed next on the substrate.

Example 3

In the apparatus of Example 2, the setting part may be configured to set the processing parameters by comparing the difference value with a predetermined target value. In this case, it is possible to bring the edge position of the film to be formed next on the substrate closer to the predetermined target value.

Example 4

In the apparatus of any one of Examples 1 to 3, the first calculation part may be configured to perform: a first process of calculating a position, in the captured image of the reference substrate, of a reference marker preset on the reference substrate and having a known distance from the center of the reference substrate; a second process of calculating, as a size in the captured image of the reference substrate, a difference between a design dimension of a radius of the reference substrate and an actual position of the reference marker; and a third process of calculating the theoretical peripheral edge position of the reference substrate based on the position obtained in the first process and the size obtained in the second process. In this case, even if the captured image of the reference substrate does not include the center of the reference substrate, it is possible to calculate the theoretical peripheral edge position of the reference substrate with reference to the center of the reference substrate.

Example 5

In the apparatus of any one of Examples 1 to 4, the second calculation part may be configured to perform: a fourth process of calculating a peripheral edge position of the workpiece substrate based on the captured image of the workpiece substrate; a fifth process of calculating an eccentricity state of the workpiece substrate based on the peripheral edge position of the workpiece substrate; and a sixth process of calculating the theoretical peripheral edge position of the workpiece substrate in consideration of the eccentricity state of the workpiece substrate. In this case, it is possible to obtain the theoretical peripheral edge position of the workpiece substrate in which the eccentricity state of the workpiece substrate is reduced or eliminated. Therefore, it is possible to process the peripheral edge portion of the film with higher precision according to the processing parameters newly set by using the peripheral edge position.

Example 6

The apparatus of any one of Examples 1 to 5 may further include: a first adjustment part configured to adjust a placement position of the substrate on a holding part of the processing part according to an eccentricity state of the substrate placed and processed on the holder. In this case, the eccentricity state of the substrate is reduced or eliminated by adjusting the placement position of the substrate on the holder. Therefore, it becomes possible to process the peripheral edge portion of the film with higher precision.

Example 7

In the apparatus of Example 6, the processing part may further include a detection part arranged near the peripheral edge portion of the substrate held by the holder and configured to detect an eccentricity amount of the substrate with respect to the holder, and the first adjustment part may be configured to adjust the placement position of the substrate with respect to the holder according to the eccentricity amount when the eccentricity amount is equal to or greater than a predetermined first threshold value. In the case in which the detection part is arranged near the peripheral edge portion of the substrate, when the eccentricity amount of the substrate is smaller than the predetermined first threshold value, the peripheral edge position of the substrate may be detected with extremely high precision. However, when the eccentricity amount of the substrate is equal to or greater than the predetermined first threshold value, an error may increase. Therefore, as in Example 7, the placement position is adjusted in a situation where the error is large, by adjusting the placement position of the substrate with respect to the holder when the eccentricity amount of the substrate is equal to or greater than the predetermined first threshold value. However, in a situation where the error is not so large, the placement position is not adjusted. Accordingly, the frequency of adjustment of the placement position is reduced, which makes it possible to improve the processing efficiency when processing a plurality of substrates.

Example 8

The apparatus of any one of Examples 1 to 7 may further include: a second adjustment part configured to adjust an exposure position for a peripheral edge portion of a film formed on a front surface of the substrate according to an eccentricity state of the substrate placed and processed on a holder of the processing part. In this case, the peripheral edge portion of the film is exposed while canceling the eccentricity state of the substrate. Therefore, the peripheral edge portion of the film is exposed with a uniform width, which makes it possible to process the peripheral edge portion of the film with higher precision.

Example 9

In the apparatus of any one of Examples 1 to 8, the setting part may be configured to correct a supply condition of a processing liquid when a designated value of a processing width of the peripheral edge portion of the substrate processed by the processing liquid is smaller than a predetermined second threshold value, and the processing part may further include a holder configured to rotatably hold the workpiece substrate and a supply part configured to supply the processing liquid from a nozzle to the peripheral edge portion of the substrate based on the supply condition. On the other hand, the vicinity of the peripheral edge of the substrate may be chamfered according to specifications of the substrate. Therefore, when the processing liquid is supplied to the chamfered portion of the substrate, the processing liquid tends to be discharged from the front surface of the substrate, and the processing of the peripheral edge portion of the film with the processing liquid may not be promoted. However, in Example 9, when the designated value of the processing width of the peripheral edge portion of the substrate processed by the processing liquid is smaller than the second threshold value, the supply condition of the processing liquid supplied from the nozzle is corrected. Therefore, the peripheral edge portion of the film is processed according to the target value while eliminating the influence of the chamfered portion of the substrate. Accordingly, it becomes possible to process the peripheral edge portion of the film with higher precision.

Example 10

In the apparatus of Example 9, the setting part may be configured to, when the designated value of the processing width of the peripheral edge portion of the substrate processed by the processing liquid is smaller than a predetermined target value, correct a horizontal position of the nozzle so that a landing position of the processing liquid on the substrate is located on a central side of the substrate, correct a height position of the nozzle so that the nozzle approaches the substrate, correct an angle of the nozzle so that a supply angle of the processing liquid to the substrate approaches 90 degrees, or correct a supply amount of the processing liquid so that a discharge flow rate of the processing liquid discharged from the nozzle increases. In this case, by controlling various parameters relating to the nozzle, it is possible to relatively easily correct the supply condition of the processing liquid supplied from the nozzle.

Example 11

An example of a peripheral edge processing method includes: capturing a peripheral edge portion of a substrate, which includes a reference substrate and a workpiece substrate, so as to acquire a captured image of the reference substrate and a captured image of the workpiece substrate; calculating a theoretical peripheral edge position of the reference substrate in the captured image of the reference substrate with reference to a center of the reference substrate; calculating a theoretical peripheral edge position of the workpiece substrate in the captured image of the workpiece substrate based on the theoretical peripheral edge position of the reference substrate and the captured image of the workpiece substrate; setting processing parameters for the peripheral edge portion of the substrate based on the theoretical peripheral edge position of the workpiece substrate; and processing the peripheral edge portion of the substrate based on the processing parameters. In this case, the same effects as those of the apparatus of Example 1 are obtained.

Example 12

The method of Example 11 may further include: calculating an edge position of a film formed on a front surface of the workpiece substrate based on the captured image of the workpiece substrate, and the setting the processing parameters may include setting the processing parameters based on a difference value between the theoretical peripheral edge position of the workpiece substrate and the edge position of the film. In this case, the same effects as those of the apparatus of Example 2 are obtained.

Example 13

In the method of Example 12, the setting the processing parameters may include setting the processing parameters by comparing the difference value with a predetermined target value. In this case, the same effects as those of the apparatus of Example 3 are obtained.

Example 14

In the method of any one of Examples 11 to 13, the calculating the theoretical peripheral edge position of the reference substrate may include: a first process of calculating a position, in the captured image of the reference substrate, of a reference marker preset on the reference substrate and having a known distance from the center of the reference substrate; a second process of calculating, as a size in the captured image of the reference substrate, a difference between a design dimension of a radius of the reference substrate and an actual position of the reference marker; and a third process of calculating the theoretical peripheral edge position of the reference substrate based on the position obtained in the first process and the size obtained in the second process. In this case, the same effects as those of the apparatus of Example 4 are obtained.

Example 15

In the method of any one of Examples 11 to 14, the calculating the theoretical peripheral edge position of the workpiece substrate may include: a fourth process of calculating a peripheral edge position of the workpiece substrate based on the captured image of the workpiece substrate; a fifth process of calculating an eccentricity state of the workpiece substrate based on the peripheral edge position of the workpiece substrate; and a sixth process of calculating the theoretical peripheral edge position of the workpiece substrate in consideration of the eccentricity state of the workpiece substrate. In this case, the same effects as those of the apparatus of Example 5 are obtained.

Example 16

The method of any one of Examples 11 to 15 may further include: adjusting a placement position of the workpiece substrate on a holder according to an eccentricity state of the substrate placed and processed on the holder. In this case, the same effects as those of the apparatus of Example 6 are obtained.

Example 17

In the method of Example 16, the processing the peripheral edge portion of the substrate further includes detecting an eccentricity amount of the substrate with respect to the holder by a detection part arranged near the peripheral edge portion of the substrate held by the holder, and the adjusting the placement position of the substrate on the holder may include adjusting the placement position of the substrate with respect to the holder according to the eccentricity amount when the eccentricity amount is equal to or greater than a predetermined first threshold value. In this case, the same effects as those of the apparatus of Example 7 are obtained.

Example 18

The method of any one of Examples 11 to 17 may further include: adjusting an exposure position for a peripheral edge portion of a film formed on a front surface of the substrate according to an eccentricity state of the substrate placed and processed on a holder. In this case, the same effects as those of the apparatus of Example 8 are obtained.

Example 19

In the method of any one of Examples 11 to 18, the setting the processing parameters may include correcting a supply condition of a processing liquid when a designated value of a processing width of the peripheral edge portion of the substrate processed by the processing liquid is smaller than a predetermined second threshold value, and the processing the peripheral edge portion of the substrate may further include placing the substrate on a holder configured to rotatably hold the substrate and supplying the processing liquid from a nozzle to the peripheral edge portion of the substrate based on the supply condition. In this case, the same effects as those of the apparatus of Example 9 are obtained.

Example 20

In the method of Example 19, the correcting the supply condition may include, when the designated value of the processing width of the peripheral edge portion of the substrate processed by the processing liquid is smaller than a predetermined target value, correcting a horizontal position of the nozzle so that a landing position of the processing liquid on the substrate is located on a central side of the substrate, correcting a height position of the nozzle so that the nozzle approaches the substrate, correcting an angle of the nozzle so that a supply angle of the processing liquid to the substrate approaches 90 degrees, or correcting a supply amount of the processing liquid so that a discharge flow rate of the processing liquid discharged from the nozzle increases. In this case, the same effects as those of the apparatus of Example 10 are obtained.

Example 21

An example of a computer-readable recording medium may store a program for causing the peripheral edge processing apparatus to execute the method of any one of Examples 11 to 20. In this case, the same effects as those of the apparatus of Example 1 are obtained. As used herein, the computer-readable recording medium may include a non-transitory computer-readable recording medium (for example, various main storage devices or various auxiliary storage devices) or a propagation signal (transitory computer-readable recording medium) (for example, a data signal that may be provided via a network).

EXPLANATION OF REFERENCE NUMERALS

1: substrate processing system, 2: coating-developing apparatus (peripheral edge processing apparatus), 20: rotary holding part (holder), 40: liquid supply part (supplier), 44: nozzle, 100: rotary holding subunit (holder), 110: exposure subunit (edge exposure part), 113: mask, 120: eccentricity detection subunit (detection part), A11, A12: transfer arm, Ctr: controller, Er1: theoretical peripheral edge position of reference substrate, Er2: theoretical peripheral edge position of workpiece substrate, L2: processing liquid, M3: first calculation part, M4: second calculation part, M5: third calculation part, M6: width calculation part, M7: setting part, M10: first adjustment part, M11: second adjustment part, R: film, R1: underlayer film (film), R2: resist film (film), RP: reference marker, U1, U11, U21, U31: liquid processing unit (processing part), U24: peripheral edge exposure unit (processing part), U3, U13, U23, U33: inspection unit (capturing part), W: substrate, W0: reference substrate, W1: workpiece substrate, Wc: peripheral edge portion, Wf: edge position of film.

What is claimed is:

1. A peripheral edge processing apparatus, comprising:
an image capturing device configured to capture a peripheral edge portion of a substrate, which includes a reference substrate and a workpiece substrate, so as to acquire a captured image of the reference substrate and a captured image of the workpiece substrate;
a substrate processing unit including a substrate holder configured to process the peripheral edge portion of the substrate based on processing parameters;
a controller configured to:
receive the captured image of the reference substrate and the captured image of the workpiece substrate from the image capturing device;
calculate a theoretical peripheral edge position of the reference substrate in the captured image of the reference substrate with reference to a center of the reference substrate;
calculate a theoretical peripheral edge position of the workpiece substrate in the captured image of the workpiece substrate based on the theoretical peripheral edge position of the reference substrate and the captured image of the workpiece substrate;
set the processing parameters for the peripheral edge portion of the substrate based on the theoretical peripheral edge position of the workpiece substrate, process the peripheral edge portion of the substrate based on the processing parameters;
adjust a placement position of the workpiece substrate on the substrate holder of the substrate processing unit from a first placement position to a second placement position according to an eccentricity state of the workpiece substrate placed and processed on the substrate holder;
perform a fourth process of calculating a peripheral edge position of the workpiece substrate based on the captured image of the workpiece substrate, and a fifth process of calculating the eccentricity state of the workpiece substrate based on the peripheral edge position of the workpiece substrate; and
calculate the second placement position of the workpiece substrate to cancel an eccentricity amount of the workpiece substrate with respect to the substrate holder, generate a control signal for delivering the workpiece substrate to the substrate holder at the second placement position of the workpiece substrate, and output the control signal to a transfer arm; and
the transfer arm configured to receive the control signal and, by the received control signal, deliver the workpiece substrate to the substrate holder at the second placement position of the workpiece substrate.

2. The peripheral edge processing apparatus of claim 1, wherein the controller is further configured to:
calculate an edge position of a film formed on a front surface of the workpiece substrate based on the captured image of the workpiece substrate; and set the processing parameters based on a difference value between the theoretical peripheral edge position of the workpiece substrate and the edge position of the film.

3. The peripheral edge processing apparatus of claim 2, wherein the controller is further configured to set the processing parameters by comparing the difference value with a predetermined target value.

4. The peripheral edge processing apparatus of claim 1, wherein the controller is further configured to perform:
   a first process of calculating a position, in the captured image of the reference substrate, of a reference marker preset on the reference substrate and having a known distance from the center of the reference substrate;
   a second process of calculating, as a size in the captured image of the reference substrate, a difference between a design dimension of a radius of the reference substrate and an actual position of the reference marker; and
   a third process of calculating the theoretical peripheral edge position of the reference substrate based on the position obtained in the first process and the size obtained in the second process.

5. The peripheral edge processing apparatus of claim 1, wherein the controller is further configured to perform
   a sixth process of calculating the theoretical peripheral edge position of the workpiece substrate in consideration of the eccentricity state of the workpiece substrate.

6. The peripheral edge processing apparatus of claim 1, wherein the substrate processing unit further includes a detector arranged near the peripheral edge portion of the substrate held by the substrate holder and configured to detect the eccentricity amount of the substrate with respect to the substrate holder, and
   wherein the controller is further configured to adjust the placement position of the workpiece substrate with respect to the substrate holder according to the eccentricity amount of the substrate with respect to the substrate holder when the eccentricity amount of the substrate with respect to the substrate holder is equal to or greater than a predetermined first threshold value.

7. The peripheral edge processing apparatus of claim 1, wherein the controller is further configured to adjust an exposure position for a peripheral edge portion of a film formed on a front surface of the substrate according to an eccentricity state of the substrate placed and processed on the substrate holder of the substrate processing unit.

8. The peripheral edge processing apparatus of claim 1, wherein the controller is further configured to correct a supply condition of a processing liquid when a designated value of a processing width of the peripheral edge portion of the substrate processed by the processing liquid is smaller than a predetermined second threshold value, and
   the substrate processing unit further includes the substrate holder configured to rotatably hold the workpiece substrate and a pump configured to supply the processing liquid from a nozzle to the peripheral edge portion of the substrate based on the supply condition.

9. The peripheral edge processing apparatus of claim 8, wherein the controller is further configured to, when the designated value of the processing width of the peripheral edge portion of the substrate processed by the processing liquid is smaller than a predetermined target value, correct a horizontal position of the nozzle so that a landing position of the processing liquid on the substrate is located on a central side of the substrate, correct a height position of the nozzle so that the nozzle approaches the substrate, correct an angle of the nozzle so that a supply angle of the processing liquid to the substrate approaches 90 degrees, or correct a supply amount of the processing liquid so that a discharge flow rate of the processing liquid discharged from the nozzle increases.

10. A peripheral edge processing method, comprising:
    capturing, by an image capturing device, a peripheral edge portion of a substrate, which includes a reference substrate and a workpiece substrate, so as to acquire a captured image of the reference substrate and a captured image of the workpiece substrate;
    receiving, by a controller, the captured image of the reference substrate and the captured image of the workpiece substrate from the image capturing device
    calculating, by the controller, a theoretical peripheral edge position of the reference substrate in the captured image of the reference substrate with reference to a center of the reference substrate;
    calculating, by the controller, a theoretical peripheral edge position of the workpiece substrate in the captured image of the workpiece substrate based on the theoretical peripheral edge position of the reference substrate and the captured image of the workpiece substrate;
    setting, by the controller, processing parameters for the peripheral edge portion of the substrate based on the theoretical peripheral edge position of the workpiece substrate;
    processing, by a substrate processing unit including a substrate holder, the peripheral edge portion of the substrate based on the processing parameters;
    adjusting, by the controller, a placement position of the workpiece substrate on the substrate holder of the substrate processing unit from a first placement position to a second placement position according to an eccentricity state of the workpiece substrate placed and processed on the substrate holder,
    performing, by the controller, a fourth process of calculating a peripheral edge position of the workpiece substrate based on the captured image of the workpiece substrate, and a fifth process of calculating the eccentricity state of the workpiece substrate based on the peripheral edge position of the workpiece substrate
    calculating, by the controller, the second placement position of the workpiece substrate to cancel an eccentricity amount of the workpiece substrate with respect to the substrate holder;
    generating, by the controller, a control signal for delivering the workpiece substrate to the substrate holder at the second placement position of the workpiece substrate;
    outputting, by the controller, the control signal to a transfer arm; and
    receiving, by the transfer arm, the control signal and, by the received control signal, delivering the workpiece substrate to the substrate holder at the second placement position of the workpiece substrate.

11. The peripheral edge processing method of claim 10, further comprising:
    calculating, by the controller, an edge position of a film formed on a front surface of the workpiece substrate based on the captured image of the workpiece substrate,
    wherein the setting the processing parameters includes setting the processing parameters based on a difference value between the theoretical peripheral edge position of the workpiece substrate and the edge position of the film.

12. The peripheral edge processing method of claim 11, wherein the setting, by the controller, the processing parameters includes setting the processing parameters by comparing the difference value with a predetermined target value.

13. The peripheral edge processing method of claim 10, wherein the calculating, by the controller, the theoretical peripheral edge position of the reference substrate includes:
    a first process of calculating a position, in the captured image of the reference substrate, of a reference marker preset on the reference substrate and having a known distance from the center of the reference substrate;
    a second process of calculating, as a size in the captured image of the reference substrate, a difference between a design dimension of a radius of the reference substrate and an actual position of the reference marker; and
    a third process of calculating the theoretical peripheral edge position of the reference substrate based on the position obtained in the first process and the size obtained in the second process.

14. The peripheral edge processing method of claim 10, wherein the calculating, by the controller, the theoretical peripheral edge position of the workpiece substrate includes
    a sixth process of calculating the theoretical peripheral edge position of the workpiece substrate in consideration of the eccentricity state of the workpiece substrate.

15. The peripheral edge processing method of claim 10, wherein the processing, by the substrate processing unit, the peripheral edge portion of the substrate further includes detecting the eccentricity amount of the substrate with respect to the substrate holder by a detector arranged near the peripheral edge portion of the substrate held by the substrate holder, and
    the adjusting, by the controller, the placement position of the workpiece substrate on the substrate holder includes adjusting the placement position of the substrate with respect to the substrate holder according to the eccentricity amount of the substrate with respect to the substrate holder when the eccentricity amount of the substrate with respect to the substrate holder is equal to or greater than a predetermined first threshold value.

16. The peripheral edge processing method of claim 10, further comprising:
    adjusting, by the controller, an exposure position for a peripheral edge portion of a film formed on a front surface of the substrate according to an eccentricity state of the substrate placed and processed on the substrate holder.

17. The peripheral edge processing method of claim 10, wherein the setting, by the controller, the processing parameters includes correcting a supply condition of a processing liquid when a designated value of a processing width of the peripheral edge portion of the substrate processed by the processing liquid is smaller than a predetermined second threshold value, and
    the processing, by the substrate processing unit, the peripheral edge portion of the substrate further includes placing the substrate on the substrate holder configured to rotatably hold the substrate and supplying, by a pump, the processing liquid from a nozzle to the peripheral edge portion of the substrate based on the supply condition.

18. The peripheral edge processing method of claim 17, wherein the correcting, by the controller, the supply condition includes, when the designated value of the processing width of the peripheral edge portion of the substrate processed by the processing liquid is smaller than a predetermined target value, correcting a horizontal position of the nozzle so that a landing position of the processing liquid on the substrate is located on a central side of the substrate, correcting a height position of the nozzle so that the nozzle approaches the substrate, correcting an angle of the nozzle so that a supply angle of the processing liquid to the substrate approaches 90 degrees, or correcting a supply amount of the processing liquid so that a discharge flow rate of the processing liquid discharged from the nozzle increases.

19. A computer-readable recording medium that stores a program for causing a peripheral edge processing apparatus to execute the peripheral edge processing method of claim 10.

* * * * *